US009653472B2

(12) United States Patent
Lee et al.

(10) Patent No.: US 9,653,472 B2
(45) Date of Patent: May 16, 2017

(54) SEMICONDUCTOR DEVICE, METHOD OF FABRICATING THE SEMICONDUCTOR DEVICE, AND METHOD OF FORMING EPITAXIAL LAYER

(71) Applicants: Woong Lee, Seoul (KR); Chae Ho Kim, Seoul (KR); Kyong Won An, Seoul (KR); Joon Suk Lee, Seoul (KR); Woo Sung Lee, Yongin-si (KR); Hun Hyeong Lim, Hwaseong-si (KR)

(72) Inventors: Woong Lee, Seoul (KR); Chae Ho Kim, Seoul (KR); Kyong Won An, Seoul (KR); Joon Suk Lee, Seoul (KR); Woo Sung Lee, Yongin-si (KR); Hun Hyeong Lim, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 5 days.

(21) Appl. No.: 14/657,663

(22) Filed: Mar. 13, 2015

(65) Prior Publication Data

US 2016/0056169 A1    Feb. 25, 2016

(30) Foreign Application Priority Data

Aug. 22, 2014  (KR) ................. 10-2014-0109921

(51) Int. Cl.
*H01L 27/115*     (2006.01)
*H01L 27/11582*   (2017.01)
*H01L 29/792*     (2006.01)
*H01L 27/11578*   (2017.01)
*H01L 27/105*     (2006.01)
(Continued)

(52) U.S. Cl.
CPC .... *H01L 27/11582* (2013.01); *H01L 27/1052* (2013.01); *H01L 27/11565* (2013.01); *H01L 27/11578* (2013.01); *H01L 29/7926* (2013.01); *H01L 27/11519* (2013.01); *H01L 27/11556* (2013.01)

(58) Field of Classification Search
CPC ......... H01L 21/02109; H01L 21/02365; H01L 21/02436; H01L 21/02518
See application file for complete search history.

(56) References Cited

U.S. PATENT DOCUMENTS 3,619,326 A    11/1971  Burbidge
3,670,552 A     6/1972  Kaspers
(Continued)

FOREIGN PATENT DOCUMENTS

| JP | 2907133 B2    | 6/1999  |
| JP | 2008542183 A  | 11/2008 |
| JP | 4249765 B2    | 4/2009  |
| KR | 100406580 B1  | 11/2003 |
| KR | 100431295 B1  | 5/2004  |

(Continued)

*Primary Examiner* — Cheung Lee
(74) *Attorney, Agent, or Firm* — Harness, Dickey & Pierce, P.L.C.

(57) ABSTRACT

According to example embodiments, a method of fabricating a semiconductor device includes alternately stacking interlayer insulating layers and intermediate layers on a substrate, forming openings passing through the interlayer insulating layers and the intermediate layers to form recessed regions in the substrate, forming first epitaxial layers on recessed surfaces in the recessed regions, and forming second epitaxial layers using the first epitaxial layers as seed layers. The second epitaxial layers fill the recessed regions and extend above the substrate.

20 Claims, 33 Drawing Sheets

(51) Int. Cl.
*H01L 27/11565* (2017.01)
*H01L 27/11556* (2017.01)
*H01L 27/11519* (2017.01)

(56) References Cited

U.S. PATENT DOCUMENTS

| | | |
|---|---|---|
| 5,574,496 A | 11/1996 | Nielsen et al. |
| 5,753,555 A | 5/1998 | Hada |
| 5,963,822 A | 10/1999 | Saihara et al. |
| 2002/0009882 A1 | 1/2002 | Shin et al. |
| 2003/0005881 A1 | 1/2003 | Shin |
| 2003/0087512 A1 | 5/2003 | Cheong |
| 2006/0048702 A1 | 3/2006 | Son et al. |
| 2006/0270076 A1 | 11/2006 | Imer et al. |
| 2006/0286298 A1 | 12/2006 | Ha et al. |
| 2008/0014736 A1 | 1/2008 | Kawakita |
| 2010/0230737 A1 | 9/2010 | Kuroki |
| 2011/0101443 A1* | 5/2011 | Huo ................. H01L 27/11551 257/324 |
| 2011/0294290 A1* | 12/2011 | Nakanishi ......... H01L 27/11551 438/666 |
| 2011/0316064 A1* | 12/2011 | Kim ................. H01L 27/11582 257/314 |
| 2013/0134492 A1* | 5/2013 | Yang ................ H01L 27/11582 257/314 |

FOREIGN PATENT DOCUMENTS

| KR | 100611061 B1 | 8/2006 |
|---|---|---|
| KR | 100624098 B1 | 9/2006 |
| KR | 101162258 B1 | 7/2012 |

\* cited by examiner

SEMICONDUCTOR DEVICE, METHOD OF FABRICATING THE SEMICONDUCTOR DEVICE, AND METHOD OF FORMING EPITAXIAL LAYER

CROSS-REFERENCE TO RELATED APPLICATION

This application claims priority under 35 U.S.C. §119 to Korean Patent Application No. 10-2014-0109921 filed on Aug. 22, 2014 with the Korean Intellectual Property Office, the entire disclosure of which is incorporated herein by reference.

BACKGROUND

Some electronic products have been gradually reduced in overall size, while demand for processing high capacity data has increased. Accordingly, it is desirable to increase the degree of integration of semiconductor devices used to such electronic products. As one method for implementing high integration therein, semiconductor devices having vertical transistor structures instead of planar transistor structures have been introduced.

SUMMARY

An aspect of the present disclosure relates to a semiconductor device having improved reliability and a method of fabricating the semiconductor device.

An aspect of the present disclosure may also relate to a method of forming an epitaxial layer having improved quality.

According to example embodiments, a method of fabricating a semiconductor device includes alternately stacking interlayer insulating layers and sacrificial layers on a substrate; forming recessed regions in the substrate, the forming recessed regions including forming openings passing through the interlayer insulating layers and the sacrificial layers; forming first epitaxial layers on recessed surfaces of the recessed regions; and forming second epitaxial layers using the first epitaxial layers as seed layers. The second epitaxial layers fill the recessed regions and extend above the substrate In example embodiments, the first epitaxial layers may be formed at a higher temperature and a higher pressure than the second epitaxial layers.

In example embodiments, the first epitaxial layers may be formed at a higher growth rate than the second epitaxial layers.

In example embodiments, the first epitaxial layers may be formed to have a higher density than the second epitaxial layers.

In example embodiments, the first epitaxial layers and the second epitaxial layers may be formed at different temperatures in the range of about 800° C. to about 900° C.

In example embodiments, the first epitaxial layers and the second epitaxial layers may be formed at different pressures in the range of about 10 Torr to about 50 Torr.

In example embodiments, the first epitaxial layers may have a substantially uniform thickness and may not extend above the substrate.

In example embodiments, a thickness of the first epitaxial layers may be in the range of about 2% to about 9% of a thickness of the second epitaxial layers.

In example embodiments, the thickness of the first epitaxial layers may be in the range of about 3 nm to about 10 nm.

In example embodiments, the method may further include cleaning the substrate before forming the first epitaxial layer. The cleaning the substrate may include using at least one of a germanium-containing material or a chlorine-containing material. The cleaning of the substrate, the forming of the first epitaxial layers, and the forming of the second epitaxial layers may be performed in-situ.

In example embodiments, an upper surface of the second epitaxial layers may be higher than an upper surface of a lowermost sacrificial layer.

In example embodiments, the method may further include forming gate dielectric layers on the second epitaxial layers along sidewalls of the openings, the gate dielectric layers including blocking layers, charge storage layers, and tunneling layers; forming channels in the openings adjacent to the gate dielectric layers; forming lateral openings by removing the sacrificial layers; oxidizing portions of the blocking layers and the second epitaxial layers exposed by the lateral openings; and forming gate electrodes by filling the lateral openings with a conductive material.

In example embodiments, the oxidizing of portions of the blocking layers and the second epitaxial layers may include oxidizing the portions of the second epitaxial layers to form insulating layers between the second epitaxial layers and the gate electrodes.

According to example embodiments, a method of fabricating a semiconductor device includes alternately stacking interlayer insulating layers and conductive layers on a substrate; forming recessed regions in the substrate, the forming recessed regions including forming openings passing through the interlayer insulating layers and the conductive layers; forming first epitaxial layers on recessed surfaces of the recessed regions; and forming second epitaxial layers using the first epitaxial layers as seed layers, the forming second epitaxial layers filling the recessed regions and to extend above the substrate.

In example embodiments, the first epitaxial layers may be formed at a higher temperature and a higher pressure than the second epitaxial layers.

In example embodiments, the method may further include forming insulating layers alongside surfaces of the openings on the first epitaxial layers before forming the second epitaxial layers.

According to example embodiments, a method of forming an epitaxial layer includes forming an insulating layer on a substrate; forming a recessed region in the substrate, the forming the recessed region including forming an opening passing though the insulating layer; forming a first epitaxial layer on a recessed surface in the recessed region; and forming a second epitaxial layer using the first epitaxial layer as a seed layer, the second epitaxial layer filling the recessed region and extending above the substrate.

According to example embodiments, a semiconductor device includes a substrate including a recessed region that includes recessed surfaces; gate electrodes and interlayer insulating layers alternately stacked on the substrate; channels passing through the gate electrodes and the interlayer insulating layers; first epitaxial layers on the recessed surface and between the substrate and the channels; and second epitaxial layers filling the recessed region and extending above the substrate from the first epitaxial layers.

In example embodiments, the first epitaxial layers may have a substantially uniform thickness and may not extend above the substrate.

In example embodiments, a density of the first epitaxial layers may be higher than the second epitaxial layers.

In example embodiments, a thickness of the first epitaxial layers may be in the range of about 2% to about 9% of a thickness of the second epitaxial layers.

In example embodiments, the thickness of the first epitaxial layers may be in the range of about 3 nm to about 10 nm.

In example embodiments, upper surfaces of the second epitaxial layers may be higher than an upper surface of a lowermost gate electrode among the gate electrodes.

In example embodiments, the semiconductor device may further include insulating layers between the second epitaxial layers and the lowermost gate electrode.

In example embodiments, the semiconductor device may further include a plurality of gate dielectric layers between the channels and the gate electrodes. Each one of the gate dielectric layers may include a tunneling layer, a charge storage layer, and a blocking layer. The gate dielectric layer may include a material different from that of the insulating layers.

According to example embodiments, a method of fabricating a semiconductor device includes alternately stacking interlayer insulating layers and intermediate layers on a substrate; forming recessed regions in the substrate, the forming recessed regions including forming openings passing through the interlayer insulating layers and the intermediate layers; forming first epitaxial layers on recessed surfaces of the recessed regions; and forming second epitaxial layers using the first epitaxial layers as seed layers. The second epitaxial layers fill the recessed regions and extend above the substrate.

In example embodiments, the method may further include forming gate dielectric layers and channel layers in the openings on top of the second epitaxial layers; and forming bit lines on top of the channel layers. The gate dielectric layer may be between the channel layers and the interlayer insulating layers.

In example embodiments, the method may further include forming lateral openings by removing the intermediate layers, and forming gate electrodes by filling the lateral openings with a conductive material.

In example embodiments, the first epitaxial layers may be formed using a first selective epitaxial growth (SEG) process operating within a mass transports limited regime, and the second epitaxial layers may be formed using a second SEG process operating within a surface reaction limited regime.

In example embodiments, the first epitaxial layers and the second epitaxial layers may be formed at different temperatures in a range of about 800° C. to about 900° C. The first epitaxial layers and the second epitaxial layers may be formed at different pressures in a range of about 10 Torr to about 50 Torr. The first epitaxial layers may be formed at a higher temperature and a higher pressure than the second epitaxial layers.

BRIEF DESCRIPTION OF DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
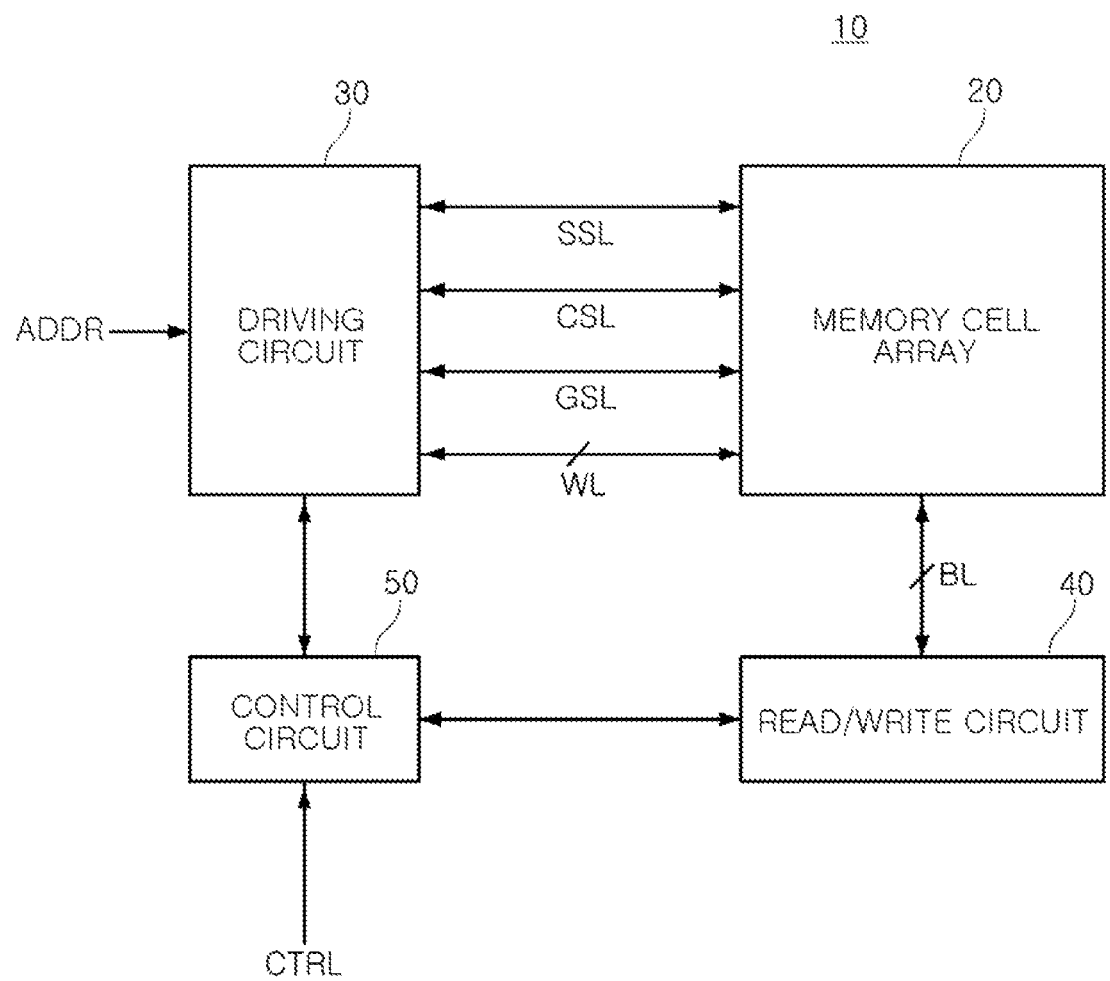
FIG. 1 is a block diagram schematically illustrating a semiconductor device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In example embodiments, the Miller index represented by a set of three integers may be used as a notation for representing a crystallographic plane or a crystallographic direction. From the crystallographic viewpoint, many planes and directions having the same relative symmetry with respect to a crystal axis are equivalent. In addition, a plane or a direction having the given Miller index may be moved within a lattice by just choosing a location and orientation of a unit cell. Those equivalent planes or directions may be expressed as one family of crystallographic planes or directions. For example, a crystallographic plane family (100) includes three equivalent planes (100), (010), and (001). Accordingly, even when an explanation for only one plane is given, the same explanation may be applied to equivalent planes in the corresponding family.

FIG. 1 is a block diagram schematically illustrating a semiconductor device according to example embodiments.

Referring to FIG. 1, a semiconductor device 10 according to example embodiments may include a memory cell array 20, a driving circuit 30, a read/write circuit 40, and a control circuit 50.

The memory cell array 20 may include a plurality of memory cells, and the plurality of memory cells may be arranged on a plurality of rows and columns. The plurality of memory cells included in the memory cell array 20 may be connected to the driving circuit 30 through a word line WL, a common source line CSL, a string select line SSL, a ground select line GSL, and the like, and connected to the read/write circuit 40 through a bit line BL. In example embodiments, a plurality of memory cells arranged on the same row are connected to the same word line WL, and a plurality of memory cells arranged on the same column are connected to the same bit line BL.

The plurality of memory cells included in the memory cell array 20 may be divided into a plurality of memory blocks. Each memory block includes a plurality of wordlines WL, a plurality of string select lines SSL, a plurality of ground select lines GSL, a plurality of bit lines BL, and at least one common source line CSL.

The driving circuit 30 and the read/write circuit 40 may be operated by the control circuit 50. In example embodiments, the driving circuit 30 may receive address information ADDR from an external device, and decode the received address information to select at least a part of the word line WL, the common source line CSL, the string select line SSL, and the ground select line GSL, connected to the memory cell array. The driving circuit 30 may include driving circuits respectively for the word line WL, the string select line SSL, and the common source line CSL.

The read/write circuit 40 may select at least a part of the bit lines BL connected to the memory cell array 20, according to a command received from control circuit 50. The read/write circuit 40 may read data stored in a memory cell connected to the selected part of the bit lines BL, or write data on the memory cell connected to the selected part of the bit lines BL. The read/write circuit 40 may include a circuit, such as a page buffer, an input/output buffer, or a data latch, in order to perform the above-described operations.

The control circuit 50 may control operations of the driving circuit 30 and the read/write circuit 40 in response to a control signal CTRL transmitted from an external device. When data stored in the memory cell array 20 is read, the control circuit 50 may control the driving circuit 30 to supply a voltage for a read operation to a word line WL storing the data to be read. When the voltage for the read operation is supplied to the specific word line WL, the control circuit 50 may control the read/write circuit 40 to read the data stored in the memory cell connected to the word line WL to which the voltage for the read operation is supplied.

Meanwhile, when data is written on the memory cell array 20, the control circuit 50 may control the driving circuit 30 to supply a voltage for a write operation to a word line WL on which the data is to be written. When the voltage for the write operation is supplied to the specific word line WL, the control circuit 50 may control the read/write circuit 40 to write the data on a memory cell connected to the word line WL to which the voltage for the write operation is supplied.

Figure 2:
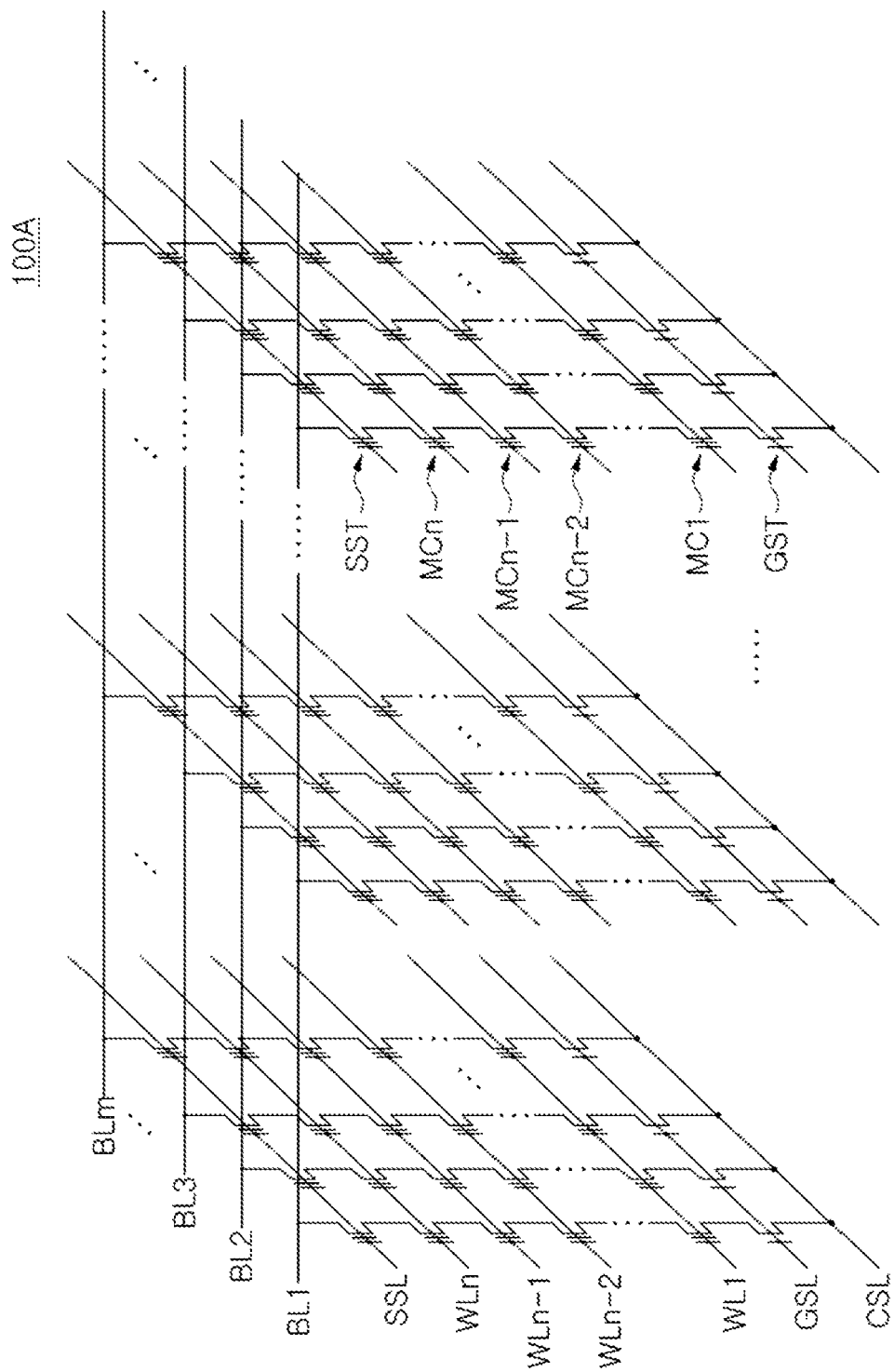
FIG. 2 is an equivalent circuit diagram of a memory cell array of a semiconductor device according to example embodiments.

FIG. 2 is an equivalent circuit diagram of a memory cell array of a semiconductor device according to example embodiments.

FIG. 2 is an equivalent circuit diagram illustrating a three-dimensional structure of a memory cell array included in a vertical structure semiconductor device 100A. Referring to FIG. 2, the memory cell array according to example embodiments may include a plurality of memory cell strings, each of which includes n memory cells MC1 to MCn connected in series, a ground select transistor GST and a string select transistor SST respectively connected to both ends of the memory cells MC1 to MCn in series.

The n memory cells MC1 to MCn connected in series may be respectively connected to word lines WL1 to WLn for selecting at least a part of the memory cells MC1 to MCn.

A gate terminal of the ground select transistor GST may be connected to a ground select line GSL, and a source terminal of the ground select transistor GST may be connected to a common source line CSL. Meanwhile, a gate terminal of the string select transistor SST may be connected to a string select line SSL, and a source terminal of the string select transistor SST may be connected to a drain terminal of a memory cell device MCn. Although FIG. 2 illustrates a structure in which one ground select transistor GST and one string select transistor SST are connected to the n memory cells MC1 to MCn connected in series, a plurality of ground select transistors GST or a plurality of string select transistors SST may be connected to the n memory cells MC1 to MCn connected in series. Each ground select transistor GST may be connected to corresponding ground selection line GSL. Each string selection transistor SST may be connected to a corresponding string selection line SSL. Several string selection transistors SST from different memory cell strings in a same row may be connected to a same string selection line SSL.

A drain terminal of the string select transistor SST may be connected to bit lines BL1 to BLm. When a voltage is applied to a gate terminal of the string select transistor SST through the string select line SSL in order to turn the string select transistor SST on, an applied signal may be transmitted to the n memory cells MC1 to MCn connected in series through the bit lines BL1 to BLm, and thereby a data read or write operation may be performed. In addition, when a voltage for turning the ground select transistor on is applied to a gate terminal of the ground select transistor GST having the source terminal connected to the common source line CSL through the ground select line GSL, an erase operation by which charges stored in the n memory cells MC1 to MCn are fully removed may be performed.

Although FIG. 2 illustrates a structure of the string selection transistor SST may be the same as a structure of the memory cells MC1 to MCn, example embodiments are not limited thereto. For example, the string selection transistor SST may alternatively have a transistor structure that only includes a single-dielectric layer as opposed to a gate dielectric layer 160 including a multi-layer structure.

Figure 3:
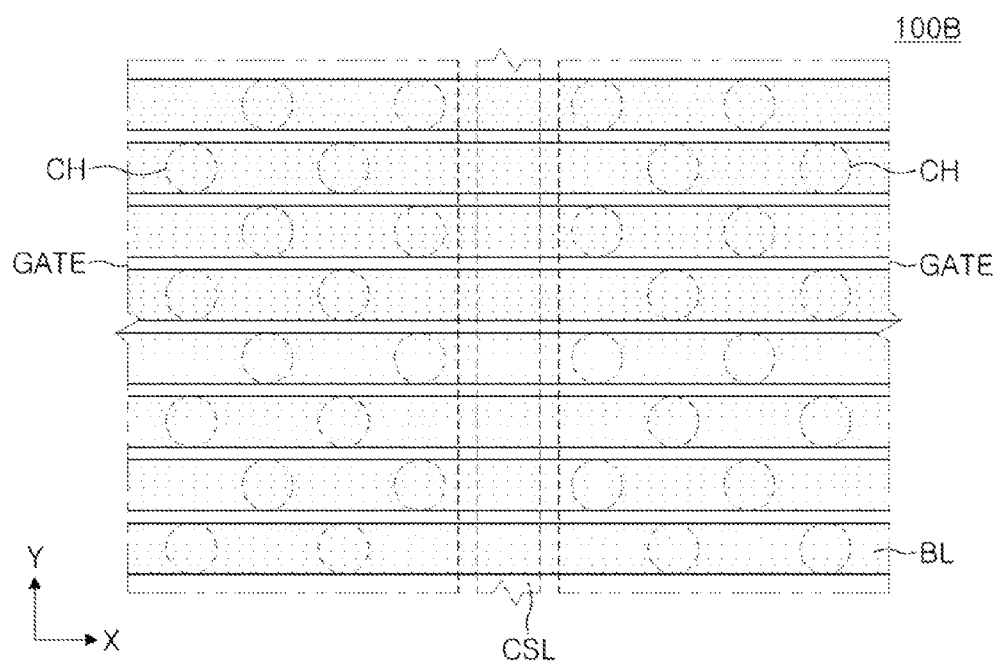
FIG. 3 is a layout schematically illustrating a semiconductor device according to example embodiments.

FIG. 3 is a layout schematically illustrating a semiconductor device according to example embodiments.

Referring to FIG. 3, a layout of a memory cell array region included in a vertical structure semiconductor device 100B is schematically illustrated. The semiconductor device 100B according to example embodiments may include gates GATE, a plurality of channels CH disposed passing through the gates GATE, a common source line CSL extending in a direction, for example, a y-direction between adjacent gates GATE, and bit lines BL extending in an x-direction from a top of the channels CH.

The gates GATE may be electrode layers of transistors of a memory cell array and have a form of a plurality of layers being stacked in a non-illustrated direction. The gates GATE may be arranged to be spaced apart from each other by a desired (and/or alternatively predetermined) distance in the x-direction, and connected to circuits in a peripheral circuit region in a non-illustrated region in the drawings.

The channels CH may pass through the gates GATE and may be arranged to form rows and columns in the x-direction and the y-direction. In the semiconductor device 100B, a memory cell string may be configured around each of the channels. The arrangement of the channels CH may differ depending on example embodiments.

In example embodiments, parts of channels CH may be dummy channels. Hereinafter, the term "dummy" may be used to refer to a configuration which has the same or similar structure and shape as or to another component, does not have a substantial function in the semiconductor device 100B, and only exists as a pattern. Accordingly, the "dummy" components do not receive an electrical signal, or electrically perform the same function, even if an electrical signal is applied thereto.

The common source line CSL may be disposed between the gates GATE in the x-direction and extend in the y-direction. The common source line CSL may function as a source area of the memory cell string.

The bit line BL may extend toward a top of one of the channels CH arranged in the x-direction, and may be electrically connected to the channels CH.

Figure 4:
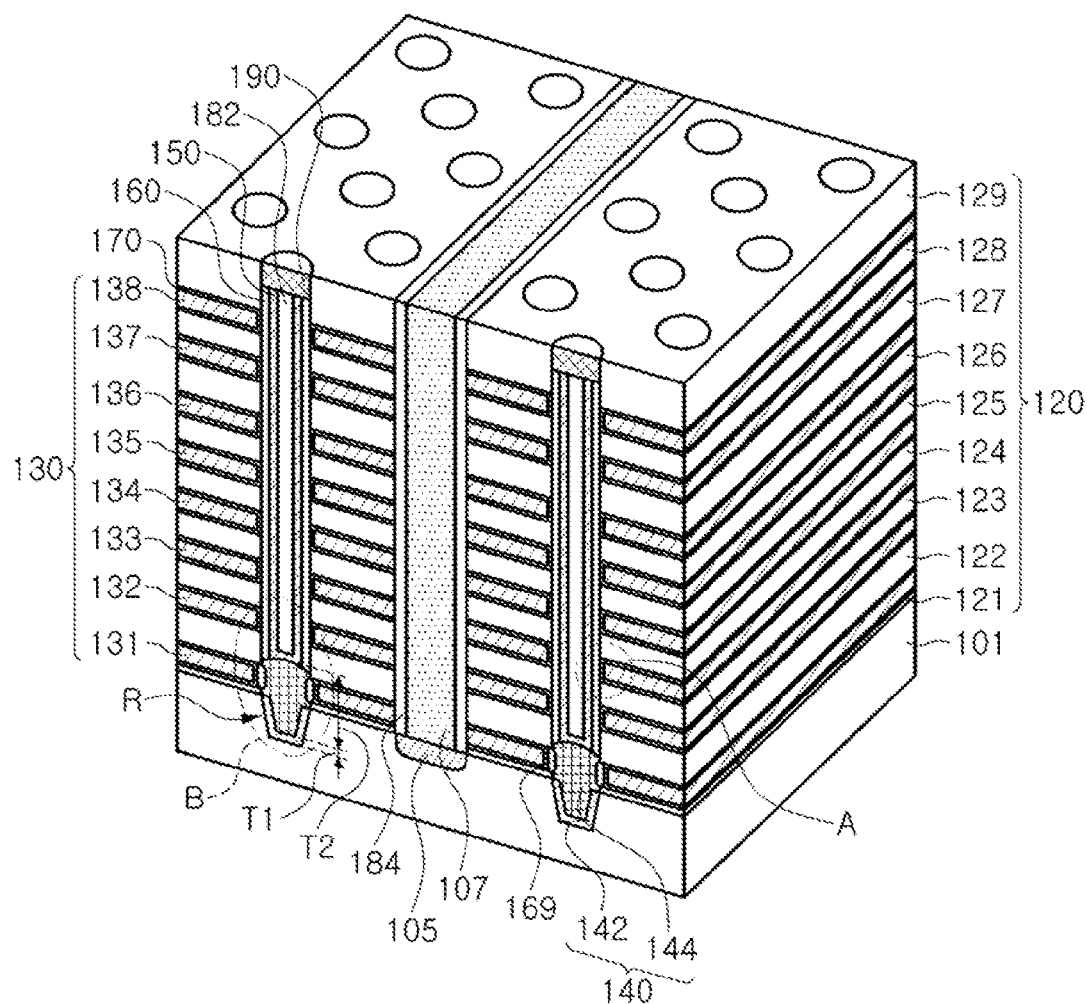
FIG. 4 is a perspective view schematically illustrating a structure of memory cell strings of a semiconductor device according to example embodiments.

FIG. 4 is a perspective view schematically illustrating a structure of memory cell strings of a semiconductor device according to example embodiments. In FIG. 4, the perspective view illustrates a portion of the region illustrated in FIG. 4.

Referring to FIG. 4, the semiconductor device 100 may include a substrate 101, a plurality of channels 150 arranged in a direction perpendicular with respect to an upper surface of the substrate 101, and a plurality of interlayer insulating layers 120 and a plurality of gate electrodes 130, stacked on outer sidewalls of the channels 150. The semiconductor device 100 may further include epitaxial layers 140 disposed on the substrate 101 under the channels 150, gate dielectric layers 160 disposed between the channels 150 and the gate electrodes 130, a common source line 107 disposed on a source region 105, and drain pads 190 disposed on the channels 150.

In the semiconductor device 100, one memory cell string may be formed with each of the channels 150 as a center, and a plurality of memory cell strings may be arranged to form rows and columns in an x-direction and a y-direction.

The substrate 101 may include the upper surface extending in the x-direction and the y-direction. The substrate 101 may include a semiconductor material, for example, a Group IV semiconductor, a Group III-V compound semiconductor, or a Group II-VI oxide semiconductor. For example, the Group IV semiconductor may include silicon, germanium, or silicon-germanium. The substrate 101 may be a bulk wafer or may be provided as an epitaxial layer. The substrate 101 may also be in the form of a semiconductor-on-insulator substrate.

The pillar-type channels 150 may be disposed to extend in a direction perpendicular with respect to the upper surface of the substrate 101, a z-direction. The channels 150 may be formed to have an annular shape surrounding first insulating layers 182. In example embodiments, the channels 150 may have a columnar shape, such as a cylindrical or prismatic shape without the first insulating layers 182. In addition, the channels 150 may have inclined side surfaces and become narrow toward the substrate 101 depending on an aspect ratio thereof.

The channels 150 may be arranged to be spaced apart from each other in the x-direction and the y-direction. However, the channels 150 may be arranged in various manners according to example embodiments, for example, in a zigzag pattern in at least one direction. In addition, the channels 150 adjacently to each other with the second insulating layers 184 in the center may be symmetrically arranged, but example embodiments are not limited thereto.

Bottom surfaces of the channels 150 may be electrically connected to the substrate 101 through the epitaxial layers 140. The channels 150 may include a semiconductor material such as polycrystalline silicon or single crystalline silicon, and the semiconductor material may be an undoped material or a material including p-type or n-type impurities.

The epitaxial layers 140 may be disposed on the substrate 101 under the channels 150, and include first and second epitaxial layers 142 and 144. The epitaxial layers 140 may be disposed on a side surface of at least one gate electrode 130. In example embodiments, the epitaxial layers 140 may be disposed side surfaces of two gate electrodes 130. The channels 150 may be electrically connected to the substrate 101 through the epitaxial layers 140 even in the case in which aspect ratios of the channels 150 increase, and ground select transistors GST (refer to FIG. 2) of the memory cell strings may have uniform characteristics.

The epitaxial layers 140 may be formed using a selective epitaxial growth (SEG) process. The epitaxial layers 140 may be polycrystalline silicon, single crystalline silicon, polycrystalline germanium, or single crystalline germanium, in which impurities are doped or not doped. For example, when the substrate 101 is single crystalline silicon, the epitaxial layers 140 may also be single crystalline silicon. However, in example embodiments, even when the substrate 101 is single crystalline silicon, at least portions of the epitaxial layers 140 may have a polycrystalline silicon structure including a plurality of grains.

First epitaxial layers 142 may be disposed on a recessed upper surface of the substrate 101 in recessed regions R of the substrate 101. The first epitaxial layers 142 may have a substantially uniform thickness and may be disposed along the recessed upper surface of the substrate 101. In example embodiments, the first epitaxial layers 142 may not extend above the substrate 101, that is, than the upper surface of substrate 101 where the recessed regions R are not formed, but is not limited thereto. In example embodiments, portions of the first epitaxial layers 142 may extend above the upper surface of the substrate 101. The first epitaxial layers 142 may function as seed layers for formation of second epitaxial layers 144.

The second epitaxial layers 144 may fill the recessed regions R and extend above the substrate 101 from the first epitaxial layers 142. Upper surfaces of the second epitaxial layers 144 may be higher than an upper surface of a lowermost gate electrode 131 and lower than a lower surface of an adjacent gate electrode 132. The upper surfaces of second epitaxial layers 144 may have a surface inclined along a crystal plane thereof. For example, when the second epitaxial layers 144 are silicon, an upper surface thereof may protrude toward the center portion thereof along a (111) crystal plane, but is not limited thereto.

Epi-insulating layers 169 may be disposed between the second epitaxial layers 144 and the gate electrode 131 adjacently to the second epitaxial layers 144. The epi-insulating layers 169 may function as a gate insulating layer of the ground select transistor GST. In example embodiments, an interlayer insulating layer 121 disposed below the gate electrode 131 may also function as the gate insulating layer of the ground select transistor GST. The epi-insulating layers 169 may be an oxide layer formed by thermally oxidizing portions of the second epitaxial layers 144. For example, the epi-insulating layers 169 may be a silicon dioxide ($SiO_2$) layer obtained by thermally oxidizing the silicon epitaxial layers 140.

The first epitaxial layers 142 may have a higher density than the second epitaxial layers 144. This is due to a difference in a formation process, which will be described later in detail with reference to FIGS. 9 and 10.

The first epitaxial layers 142 may have a first thickness T1, an average thickness, and the second epitaxial layers 144 may have a second thickness T2, a maximum thickness. The first thickness T1 may be smaller than the second thickness T2, for example, about 2% to 9% of the second thickness T2. For example, the first thickness T1 may be about 3 nm to 10 nm. However, the first thickness T1 may differ depending on the aspect ratio of the channels 150, and a depth and width of the recessed regions R.

The plurality of gate electrodes 131 to 138 collectively represented by 130 may be disposed to be spaced apart from each other in the z-direction from the substrate 101 along a side wall of each of the channels 150. Referring to FIG. 2, the gate electrodes 130 may form gates of the ground select transistor GST, a plurality of memory cells MC1 to MCn, and string select transistors SST. The gate electrodes 130 may extend to form word lines WL1 to WLn, and be commonly connected to be a desired (and/or alternatively predetermined) unit of adjacent memory cell strings arranged in the x-direction and the y-direction. In example embodiments, six gate electrodes 132 to 137 of the memory cells MC1 to MCn may be connected in series, but are not limited thereto. The number of the gate electrodes 130 configuring the memory cells MC1 to MCn may be determined depending on integrity of the semiconductor device 100. For example, the number of the gate electrodes 130 corresponding to memory cells MC1 to MCn may be $2^n$ (n is a natural number).

The gate electrode 131 of the ground select transistor GST may extend in the y-direction to form a ground select line GSL. A desired (and/or alternatively predetermined) impurities may be doped in the substrate 101 located under the gate electrode 131 for the functioning of the ground select transistor GST.

The gate electrodes 138 of the string select transistors SST may extend in the y-direction to form a string select line SSL. In particular, the gate electrodes 138 of the string select transistors SST may be separated between the memory cell strings adjacent to each other in the x-direction to form different string select lines SSL, but are not limited thereto. In example embodiments, the gate electrodes 138 may be connected between the memory cell strings adjacent to each other in the x-direction. In such a case, interconnection structures including the bit lines BL may be changed in order for the adjacent memory cell strings are connected to different bit lines BL (refer to FIG. 3). In example embodiments, the numbers of the gate electrodes 138 of the string select transistors SST and the gate electrode 131 of the ground select transistor GST may be respectively one or more, and the gate electrodes 138 of the string select transistors SST and the gate electrode 131 of the ground select transistor GST may have a different structure from the gate electrodes 132 to 137 of the memory cells MC1 to MCn.

In addition, some gate electrodes 130, for example, gate electrodes 130 disposed adjacently to the gate electrode 131 of the ground select transistor GST or the gate electrode 138 of the string select transistor SST may be dummy gate electrodes. For example, a gate electrode 132 disposed adjacently to the gate electrode 131 of the ground select transistor GST may be a dummy gate electrode.

The gate electrodes 130 may include polycrystalline silicon or a metal silicide material. The metal silicide material may be, for example, a silicide material formed of a metal selected from Co, Ni, Hf, Pt, W, and Ti. In example embodiments, the gate electrodes 130 may include a metal material, for example, tungsten (W). In addition, diffusion barrier layers 170 may be disposed to surround the gate electrodes 130. The diffusion barrier layers 170 may include, for example, at least one of tungsten nitride (WN), tantalum nitride (TaN), and titanium nitride (TiN).

A plurality of interlayer insulating layers 121 to 129 collectively represented by 120 may be disposed between the gate electrodes 130. The interlayer insulating layers 120 may be spaced apart from each other in the z-direction and extend in the y-direction, similar to the gate electrodes 130. The interlayer insulating layers 120 may include an insulating material, such as silicon oxide or silicon nitride.

The gate dielectric layers 160 may be disposed between the gate electrodes 130 and the channels 150. Although not illustrated in detail in FIG. 4, the gate dielectric layers 160 may include a tunneling layer, a charge storage layer, and a blocking layer, sequentially stacked on the channels 150, which will be described in more detail with reference to FIGS. 5A to 5C below.

The tunneling layer may transfer charges to the charge storage layer by F-N tunneling. The tunneling layer may include, for example, silicon oxide. The charge storage layer may be a charge trapping layer or a floating gate conductive layer. For example, the charge storage layer may include a dielectric material, quantum dots, or nanocrystals. Here, the quantum dots or nanocrystals may include (or consist of) a conductive material, for example, fine particles of a metal or a semiconductor. The blocking layer may include a high-k material. Here, the high-k material may refer to a dielectric material having a higher dielectric constant than silicon dioxide.

On the top of the memory cell string, the drain pads 190 may be disposed to cover an upper surface of the first insulating layers 182 and to be electrically connected to the channels 150. The drain pads 190 may include, for example, doped polycrystalline silicon. The drain pads 190 may function as drain areas of the string select transistors SST (refer to FIG. 2). The drain pads 190 may be electrically connected to the bit lines BL (refer to FIG. 2), and conductive contact plugs may further disposed between the drain pads 190 and the bit lines BL.

At the bottom of the memory cell strings, source regions 105 of the ground select lines GSL (refer to FIG. 2) arranged in the x-direction may be disposed. The source regions 105 may be disposed adjacently to the upper surface of the substrate 101, spaced apart in a desired (and/or alternatively predetermined) distance in the x-direction, and extend in the y-direction. For example, one source region 105 may be arranged for every two channels 150 in the x-direction, but example embodiments are not limited thereto. A common source line 107 may be disposed to extend along the source region 105 on the source region 105. The common source line 107 may include a conductive material. For example, the common source line 107 may include tungsten (W), aluminum (Al), or copper (Cu). The common source line 107 may be electrically separated from the gate electrodes 130 by the second insulating layers 184.

When the source region 105 has an opposite conductivity type to the substrate 101, the source region 105 may function as a source area of an adjacent ground select line GSL. When the source region 105 is the same conductivity type as the substrate 101, the source region 105 may function as a pocket P-well contact of a block-based erase operation of the memory cell strings. In such a case, the common source line 107 may function as a kind of contact plug. When a high level of voltage is applied to substrate 101 through the pocket P-well contact, data stored in all memory cells of the corresponding memory cell block of the substrate 101 may be erased.

Figure 5A:
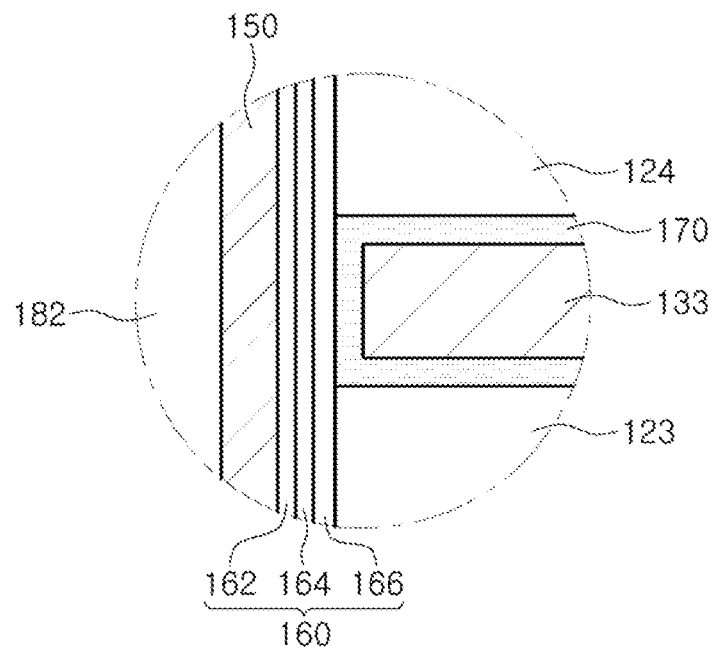
FIGS. 5A to 5C are cross-sectional views illustrating a gate dielectric layer according to example embodiments, that is, illustrating an area corresponding to area "A" of FIG. 4.
Figure 5B:
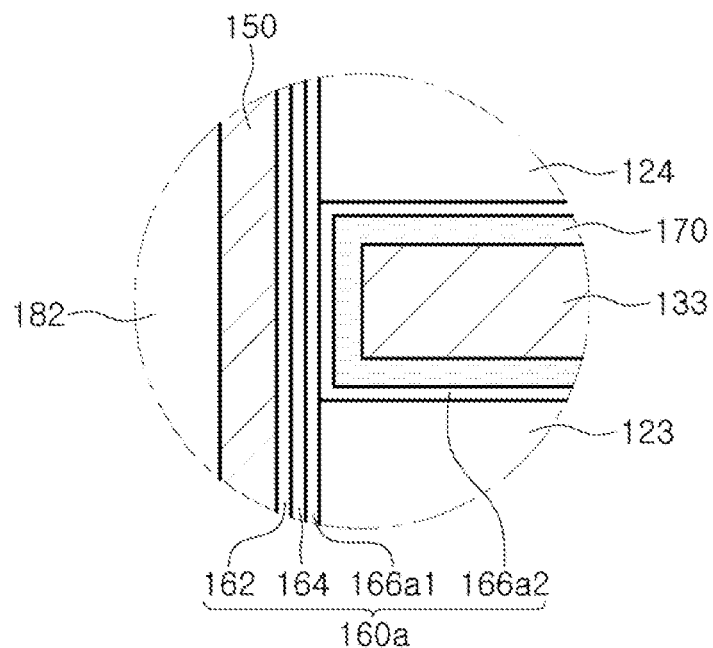
Figure 5C:
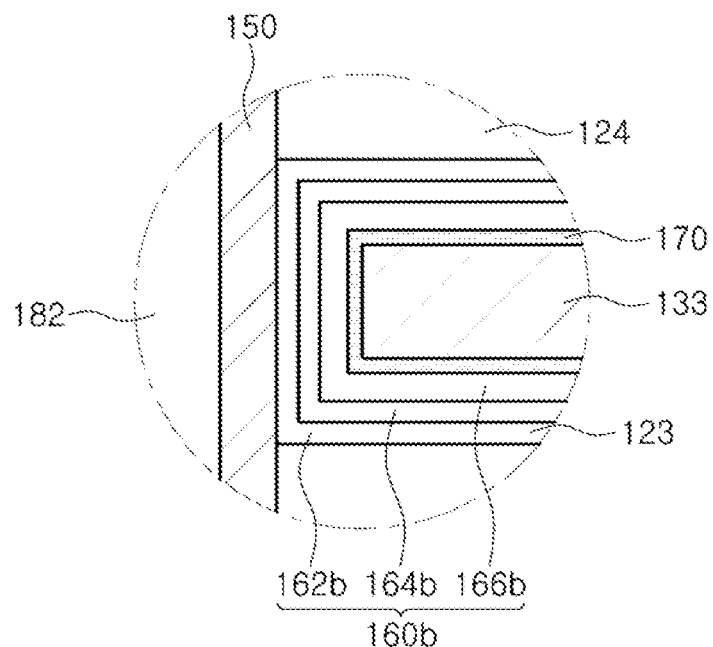

FIGS. 5A to 5C are cross-sectional views illustrating a gate dielectric layer according to example embodiments, that is, illustrating an area corresponding to area "A" of FIG. 4.

In FIG. 5A, a gate electrode 133, a diffusion barrier 170, a gate dielectric layer 160, a channel 150, and a first insulating layers 182, included in a memory cell string are illustrated. The gate dielectric layers 160 may have a structure in which a tunneling layer 162, a charge storage layer 164, and a blocking layer 166 are sequentially stacked on the channel 150. Relative thicknesses of the layers configuring the gate dielectric layer 160 are not limited to those illustrated in FIG. 5A, and may be variously changed.

In particular, all of the tunneling layer 162, charge storage layer 164, and blocking layer 166 of the gate dielectric layer 160 according to example embodiments may be disposed to vertically extend along the channel 150.

The tunneling layer 162 may include at least one of silicon dioxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$), and zirconium oxide ($ZrO_2$).

The charge storage layer 164 may be a charge trapping layer or a floating gate conductive layer. When the charge storage layer 164 is a floating gate, polycrystalline silicon may be deposited by, for example, a low pressure chemical vapor deposition (LPCVD) method. When the charge storage layer 164 is a charge trapping layer, it may include at least one of silicon dioxide ($SiO_2$), silicon nitride ($Si_3N_4$), silicon oxynitride (SiON), hafnium oxide ($HfO_2$), zirconium oxide ($ZrO_2$), and tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$), and aluminum gallium nitride ($AlGa_xN_y$).

The blocking layer 166 may include silicon dioxide ($SiO_2$), silicon nitride ($Si_3N_4$), silicon oxynitride (SiON), or high-k dielectric material. The high-k dielectric material may be any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

In FIG. 5B, a gate electrode 133, a diffusion barrier 170, a gate dielectric layer 160a, a channel 150, and a first insulating layers 182 of a memory cell string are illustrated. The gate dielectric layer 160a may have a structure in which a tunneling layer 162, a charge storage layer 164, and blocking layers 166a1 and 166a2 are sequentially stacked on the channel 150.

In example embodiments, the gate dielectric layer 160a differs from the gate dielectric layer 160 illustrated in FIG. 5A because the gate dielectric layer 160a includes the blocking layer 166a1 and 166a2 including (and/or consisting of) two layers. A first blocking layer 166a1 may vertically extend along with the channel 150, and a second blocking layer 166a2 may be disposed to surround the gate electrode 133. For example, the first blocking layer 166a1 may be a relatively low-k dielectric material, and the second blocking layer 166a2 may be a relatively high-k dielectric material. In such a case, the first blocking layer 166a1 may be disposed on a side surface of the second blocking layer 166a2 to improve characteristics the semiconductor device, for example, an erase characteristic, by controlling an energy band such as a barrier height.

In example embodiments, the first blocking layer 166a1 may be omitted and a single-layered blocking layer may be disposed to surround the gate electrode 133.

In FIG. 5C, a gate electrode 133, a diffusion barrier 170, a gate dielectric layer 160b, a channel 150, and a first insulating layers 182 of a memory cell string are illustrated. The gate dielectric layer 160b may have a structure in which a tunneling layer 162b, a charge storage layer 164b, and a blocking layer 166b are sequentially stacked on the channel 150.

In example embodiments, the gate dielectric layer 160b in FIG. 5C differs from the gate dielectric layers 160 and 160a in FIGS. 5A and 5B because gate dielectric layer 160b has a structure where the tunneling layer 162b, the charge storage layer 164b, and the blocking layer 166b may be disposed to surround the gate electrode 133 and the diffusion barrier 170.

Figure 6A:
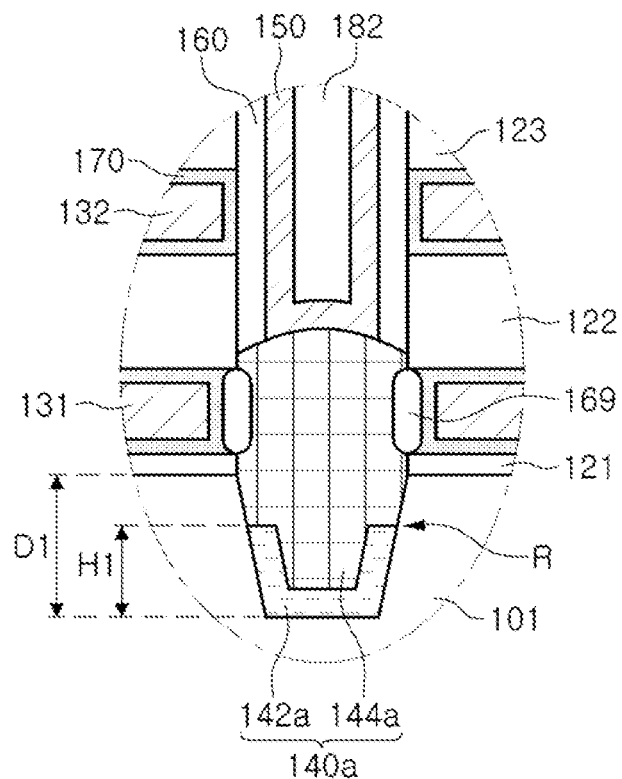
FIGS. 6A to 6C are cross-sectional views illustrating an epitaxial layer according to example embodiments, that is, illustrating an area corresponding to area "B" of FIG. 4.
Figure 6B:
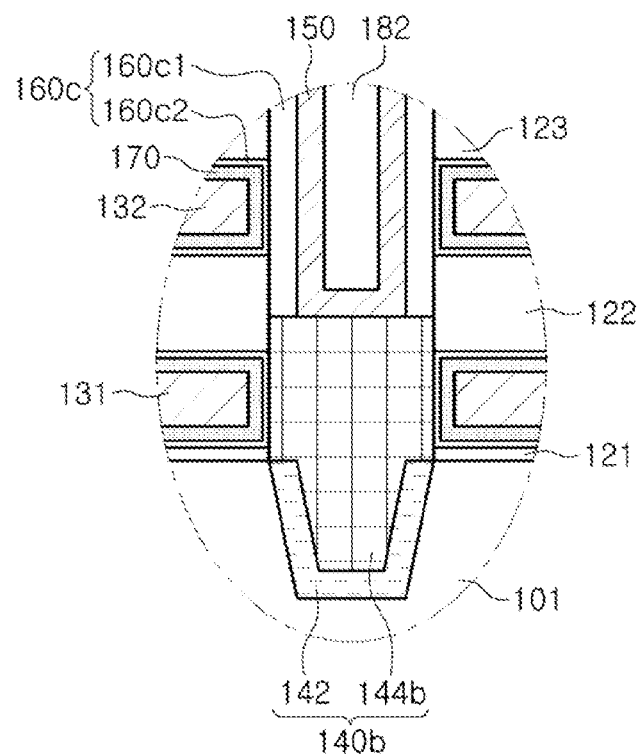
Figure 6C:
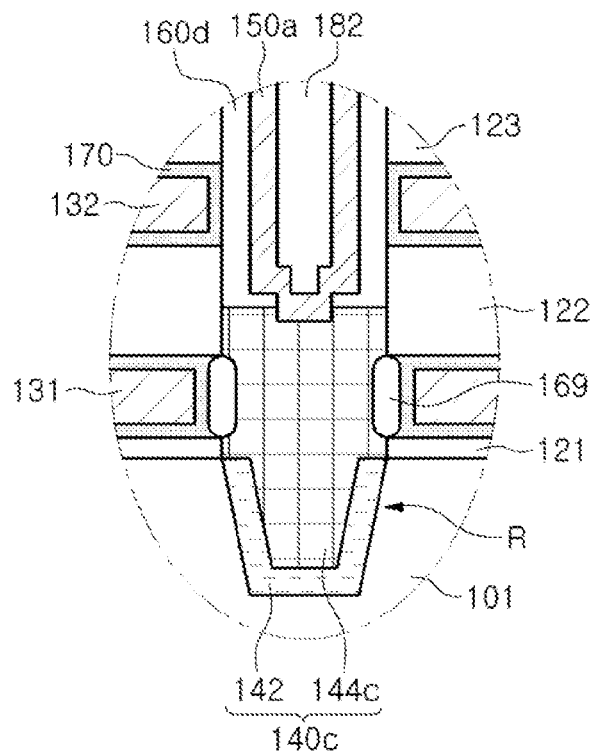

FIGS. 6A to 6C are cross-sectional views illustrating an epitaxial layer according to example embodiments, that is, illustrating an area corresponding to area "B" of FIG. 4.

In FIG. 6A, an epitaxial layer 140a including first and second epitaxial layers 142a and 144a are illustrated.

The first epitaxial layer 142a in FIG. 6A may differ from the first epitaxial layer 142 in FIG. 4 because the first epitaxial layer 142a may only be disposed on portions of recessed regions R of a recessed surface of the substrate 101. Accordingly, a height H1 of the first epitaxial layer 142a may be smaller than a depth D1 of the recessed regions R.

In FIG. 6B, an epitaxial layer 140b including first and second epitaxial layers 142 and 144b are illustrated.

The second epitaxial layer 144b in FIG. 6B may differ from the second epitaxial layer 144 in FIG. 4 because the second epitaxial layer 144b may have a flat upper surface. A shape of such an upper surface may be determined depending on a growth plane and a manufacturing process of the second epitaxial layer 144b.

A second layer 160c2 of a gate dielectric layer 160c may be disposed between the second epitaxial layer 144b and an adjacent gate electrode 131, instead of the epi-insulating layers 169. A gate dielectric layer 160c according to example embodiments may include a first layer 160c1 vertically extending along a channel 150, and the second layer 160c2 surrounding the gate electrode 131. The second layer 160c2 may be a layer including at least a portion of the blocking layer 166 (refer to FIG. 5A). For example, the gate dielectric layer 160c may have the same structure as the gate dielectric layer 160a of FIG. 5B. In such a case, the second layer 160c2 disposed between the gate electrode 131 and the second epitaxial layer 144b may function as a gate insulating layer of a ground select transistor GST.

In FIG. 6C, an epitaxial layer 140c including first and second epitaxial layers 142 and 144c is illustrated.

The second epitaxial layer 144c may differ from the second epitaxial layer 144a and 144b in FIGS. 6A and 6B because the second epitaxial layer 144c may include a recessed upper surface. A shape of such an upper surface may be determined by a process of removing a portion of a gate dielectric layer 160d or the like. In the process of removing a portion of a gate dielectric layer 160d to be described later with reference to FIG. 12, a portion of the second epitaxial layer 144c may also be removed to have the recessed upper surface. A channel 150a may be in contact with the second epitaxial layer 144c on the recessed upper surface.

FIGS. 7 to 17 are diagrams schematically illustrating main processes of a method of a semiconductor device according to example embodiments.

Figure 7:
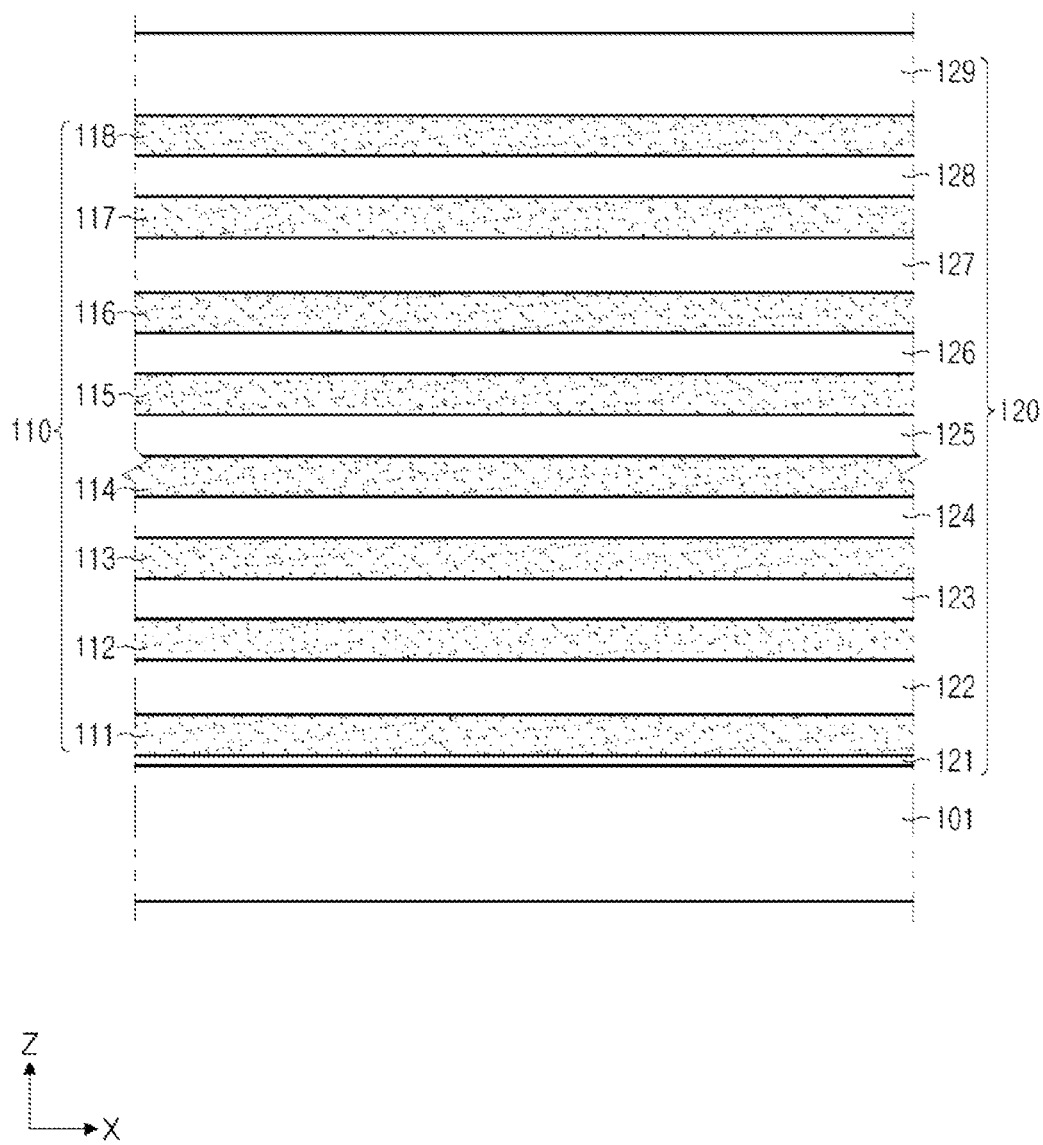
FIGS. 7 to 17 are diagrams schematically illustrating main processes of a method of a semiconductor device according to example embodiments.

Referring to FIG. 7, sacrificial layers 111 to 116 collectively represented by 110 and interlayer insulating layers 120 may be alternately stacked on a substrate 101. The interlayer insulating layers 120 and the sacrificial layers 110 may be alternately stacked on the substrate 101 from the first interlayer insulating layer 121, as illustrated in FIG. 7. The sacrificial layers 110 may also be referred to as intermediate layers.

The sacrificial layers 110 may be formed of a material having etch selectivity with respect to the interlayer insulating layers 120. That is, the sacrificial layers 110 may be formed of a material capable of being etched while minimizing an etch amount of the interlayer insulating layers 120 during the process of etching the sacrificial layers 110. Such etch selectivity may be quantitatively expressed as a ratio of an etch rate of the sacrificial layers 110 with respect to an etch rate of the interlayer insulating layers 120. For example, the interlayer insulating layers 120 may be formed of at least one of silicon oxide and silicon nitride, and the sacrificial layers 110 may be formed of a material different from that of the interlayer insulating layers 120, that is, one selected from silicon, silicon oxide, silicon carbide, and silicon nitride.

As illustrated in the drawings, in example embodiments, the interlayer insulating layers 120 may not have the same thickness. The lowermost interlayer insulating layer 121 among the interlayer insulating layers 120 may be relatively thin, and the uppermost interlayer insulating layer 129 may be relatively thick. In addition, the interlayer insulating layers 122 and 127 disposed between a ground select transistor GST and memory cells MC1 to MCn, and between a string select transistor SST and the memory cells MC1 to MCn may be relatively thicker than the interlayer insulating layers 123 to 126. However, the thicknesses of the interlayer insulating layers 120 and the sacrificial layers 110 may be variously modified, and the number of layers configuring the interlayer insulating layers 120 and the sacrificial layers 110 may also be variously modified.

In example embodiments, a desired (and/or alternatively predetermined) amount of impurities may be doped in the substrate 101 corresponding to a bottom of the gate electrode 131 of FIG. 4 for electrical connectivity between the common source line 107 and the ground select transistor GST.

Figure 8:
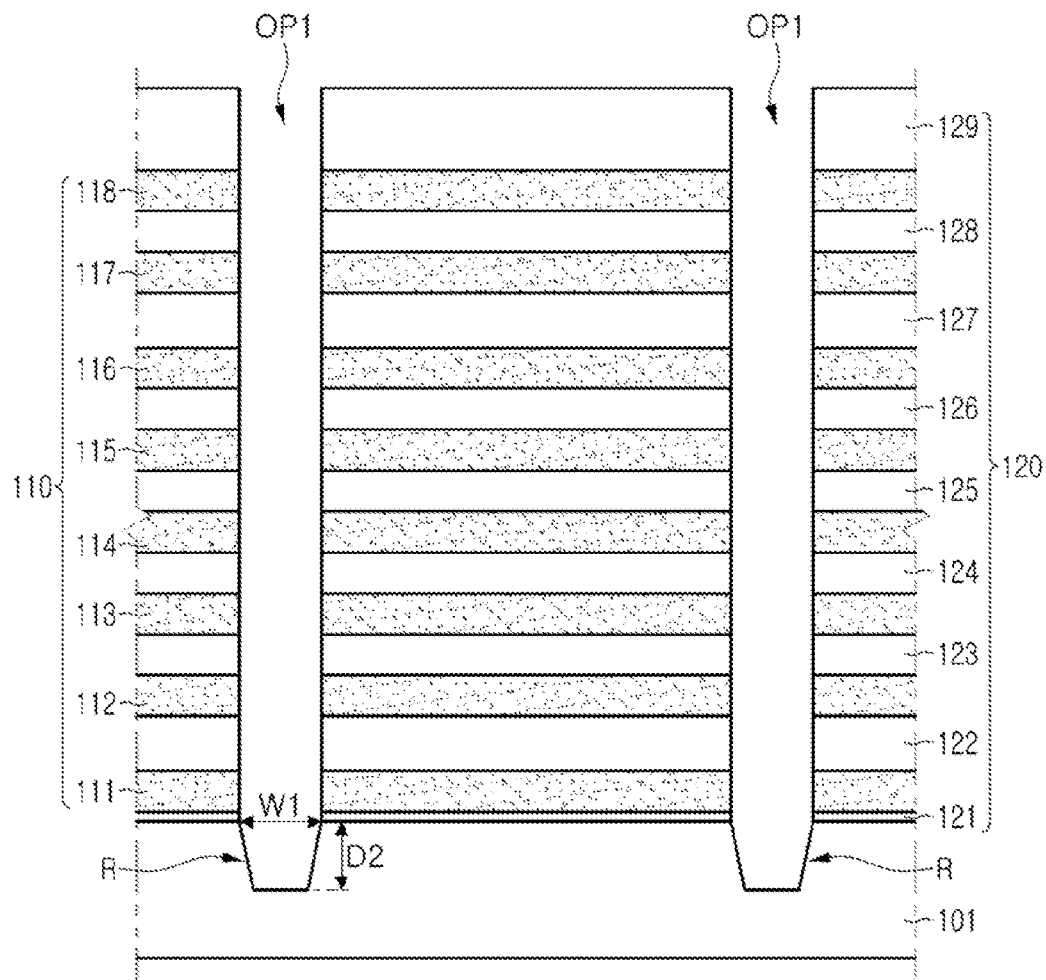

Referring to FIG. 8, hole-type first openings OP1 passing through sacrificial layers 110 and the interlayer insulating layers 120 may be formed.

The first openings OP1 may extend to the substrate 101 in the z-direction to form recessed regions R in the substrate 101. The first openings OP1 may be formed by anisotropically etching the sacrificial layers 110 and the interlayer insulating layers 120. Since a stacked structure including two different kinds of layers is etched, sidewalls of the first openings OP1 may not be perpendicular with respect to an upper surface of the substrate 101. For example, the width or the diameter of the first openings OP1 may be reduced toward the upper surface of the substrate 101.

A depth D2 of the recessed regions R may be selected depending on a width and an aspect ratio of the first openings OP1. For example, the depth D2 of the recessed regions R may be about 0.3 to 1.0 times a width W1 of the first openings OP1 measured at the upper surface of the substrate 101, but is not limited thereto. In example embodiments, the depth D2 of the recessed regions R may be in the range of about 20 nm to about 80 nm.

Figure 9:
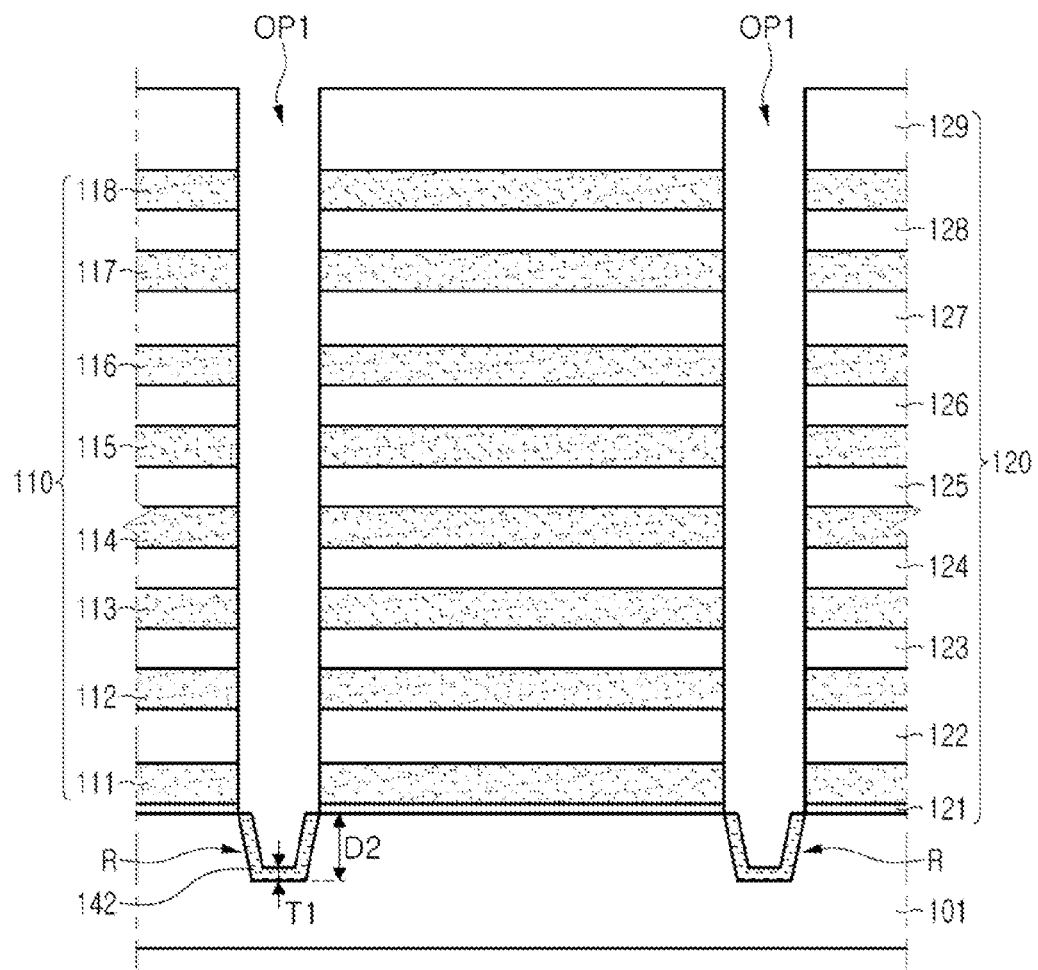

Referring to FIG. 9, first epitaxial layers 142 may be formed in the recessed regions R disposed below the first openings OP1.

In example embodiments, before the first epitaxial layers 142 are formed, a process of cleaning the substrate 101 may be further carried out using at least one of a Ge-containing material or a Cl-containing material such as HCl. The process of cleaning the substrate 101 and the process of forming the first epitaxial layers 142 may be performed in-situ. In the process of cleaning the substrate 101, the substrate 101 damaged during the etching process may be minutely removed to improve an interface state.

The first epitaxial layers 142 may be formed by an SEG process using the substrate 101 exposed in the recessed regions R as a seed. The first epitaxial layers 142 may be grown on a recessed surface of the substrate 101 to have a uniform thickness. In addition, the first epitaxial layers 142 may be formed only in the recessed regions R and may not extend above the substrate 101, but is not limited thereto. The first thickness T1, that is, thicknesses of the first epitaxial layers 142 may be in the range of 5% to 25% of the depths D2 of the recessed regions R. In example embodiments, the first thickness T1 may be in the ranged of about 3 nm to about 10 nm. While the first epitaxial layers 142 are formed, impurities may be doped therein. The impurities may be the same conductivity type impurities as those of the substrate 101, or opposite conductivity type impurities to the substrate 101.

The first epitaxial layers 142 may be formed at a relatively high temperature and high pressure, compared to the second epitaxial layers 144 to be formed in the subsequent process. In addition, a source material thereof, for example, dichlorosilane ($SiH_2Cl_2$) may be supplied at a relatively high flow rate. The first epitaxial layers 142 may be formed, for example, at a temperature in the range of 800° C. to 900° C. under a pressure in the range of 10 Torr to 50 Torr.

In particular, the first epitaxial layers 142 may be grown at a temperature within a mass transport limited regime, or a temperature relatively near such regimes. The mass transport limited regime refer to a specific temperature range in which a growth rate is constant or does not change much according to an increase in temperature, and the growth rate may depend on a mass transport of a source supplied to a reaction surface. Since the first epitaxial layers 142 are grown at a temperature within the mass transport limited regime, the growth rate may be relatively fast and thus defect generation from the recessed surface of the substrate 101 may be reduced. The defect may include voids or stacking faults generated in a case in which the first epitaxial layers 142 are locally not grown since an oxide formed on the recessed surface of the substrate 101 or impurities injected during the process interfere with movement of the source material for the first epitaxial layers 142.

The first epitaxial layers 142 may be formed to have a high atomic packing density, and therefore have a higher density than the second epitaxial layers 144 formed in the subsequent process. Accordingly, although the first and second epitaxial layers 142 and 144 are formed of the same material, they may be distinguished from each other in an electron microscopic image such as a transmission electron microscope (TEM). The first epitaxial layers 142 may have a single crystalline structure, or at least a partially polycrystalline structure. However, since the first epitaxial layers 142 have a relatively low crystal quality due to properties of a layer grown at a temperature within a mass transport limited regime, it may be formed to be thin within the range of suppressing the occurrence of defects.

Even while forming the first epitaxial layers 142, a Cl-containing material such as HCl may be supplied to side surfaces of the first openings OP1. Alternatively, the Cl-containing material may be supplied in a separate process. Thereby, the growth of undesired material on the sidewalls of the first openings OP1 as well as on a mask layer may be limited and/or prevented, and the first epitaxial layers 142 may be grown only in the recessed regions R.

Figure 10:
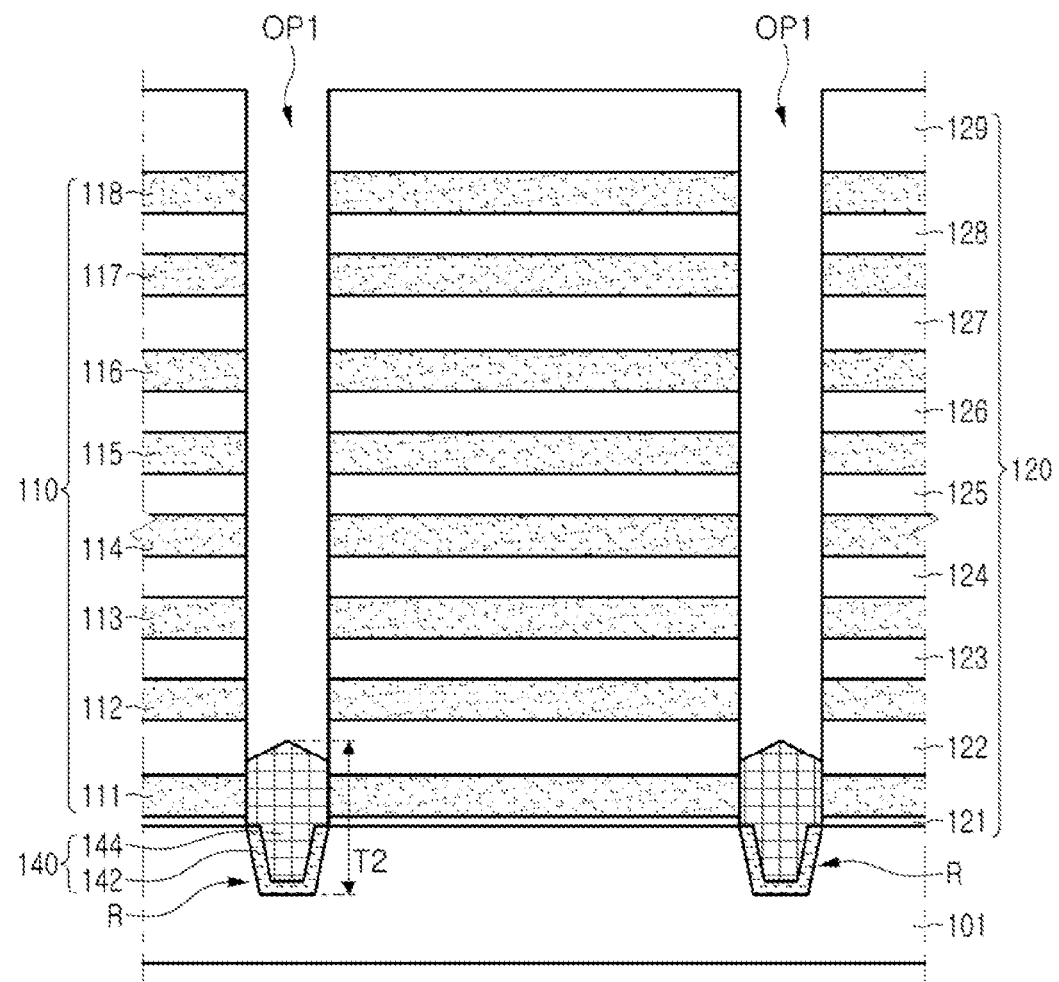

Referring to FIG. 10, second epitaxial layers 144 may be formed on the first epitaxial layers 142 disposed below the first openings OP1.

The second epitaxial layers 144 may be formed by performing an SEG process using the first epitaxial layers 142 as a seed layer. The second epitaxial layers 144 may fill the recessed regions R and extend above the substrate 101. Upper surfaces of the second epitaxial layers 144 may be higher than an upper surface of a sacrificial layer 111 disposed adjacently to the substrate 101 and lower than a lower surface of the next sacrificial layer 112.

A second thickness T2, that is, a maximum thickness of the second epitaxial layers 144 may be, for example, in the range of about 100 nm to about 180 nm, but is not limited thereto. While forming the second epitaxial layers 144, impurities may be doped.

The upper surfaces of the second epitaxial layers 144 may be inclined along a crystal plane thereof, as illustrated in FIG. 10. For example, when the substrate 101 is single crystalline Si and has a (100) plane upper surface, the inclined upper surfaces of the second epitaxial layers 144 may correspond to the (111) plane. However, the upper surface of the second epitaxial layers 144 may be formed to be flat depending on growth conditions.

The second epitaxial layers 144 may be formed in-situ with the first epitaxial layers 142. The second epitaxial layers 144 may be formed at a relatively low temperature and pressure compared to the conditions of the process of forming the first epitaxial layers 142. In addition, a source material may be supplied at a relatively low flow rate. The second epitaxial layers 144 may be formed, for example, at a temperature and a pressure which are selected to be lower than those of the process of forming the first epitaxial layers 142, in the range of about 800° C. to 900° C. and in the range of about 10 Torr to 50 Torr. For example, the second epitaxial layers 144 may be formed at a lower temperature by about 10° C. to about 30° C. and a lower pressure by about 10 Torr to about 30 Torr than those of the process of forming the first epitaxial layers 142. In example embodiments, the first epitaxial layers 142 and the second epitaxial layers 144 may be formed at different temperatures in the range of about 800° C. to about 900° C. In example embodiments, the first epitaxial layers 142 and the second epitaxial layers 144 may be formed at different pressures in the range of about 10 Torr to about 50 Torr.

In particular, the second epitaxial layers 144 may be grown at a temperature within a surface reaction limited regime, or a temperature relatively closer thereto than the temperature of growing the first epitaxial layers 142. The surface reaction limited regime refers to a specific temperature range in which a growth rate increases according to increase of the temperature, and the growth rate may depend on a reaction rate of materials on a reaction surface. Since the second epitaxial layers 144 are grown at a temperature within the surface reaction limited regime, the growth rate may be relatively slow and thus the grown epitaxial layers may have a high crystal quality. In addition, since it is easy to control the heights of the second epitaxial layers 144, variations in heights between the plurality of first openings OP1 may be reduced. Further, since the first epitaxial layers 142 do not include defects thereinside or at interfaces with the substrate 101, the second epitaxial layers 144 may not include defects generated due to the first epitaxial layers 142, too.

Even while forming the second epitaxial layers 144, a Cl-containing material such as HCl may be supplied to side surfaces of the first openings OP1 in order to increase the growth rate relatively in the recessed regions R.

According to example embodiments, since the epitaxial layers 140 are divided into two layers, that are, first and second epitaxial layers 142 and 144 and then formed under different process conditions, defects generated in the interface with the substrate 101 may be reduced and, at the same time, the epitaxial layers 140 may be grown to have a uniform thickness in the plurality of first openings OP1.

Actually, compared to a comparative example in which the epitaxial layers 140 are formed as single layers, thickness variation of the epitaxial layers 140 was reduced and the number of voids generated in the epitaxial layers 140 and voids generated in the interface with the substrate 101 was reduced by half or less, according to example embodiments. Thus, a failure rate due to leakage currents of the ground select transistor GST and leakage currents of dummy transistors including dummy gate electrodes disposed on the ground select transistor GST was reduced by an amount equal to half or more. The leakage currents of dummy transistors may be generated because the epitaxial layers 140 are formed to be relatively thick and thus a distance with the dummy transistors is reduced.

Such a method of forming the epitaxial layers 140 may be applied to various structures such as contact plugs in addition to the structure according to example embodiments, in order to limit and/or prevent defect generation.

Figure 11:
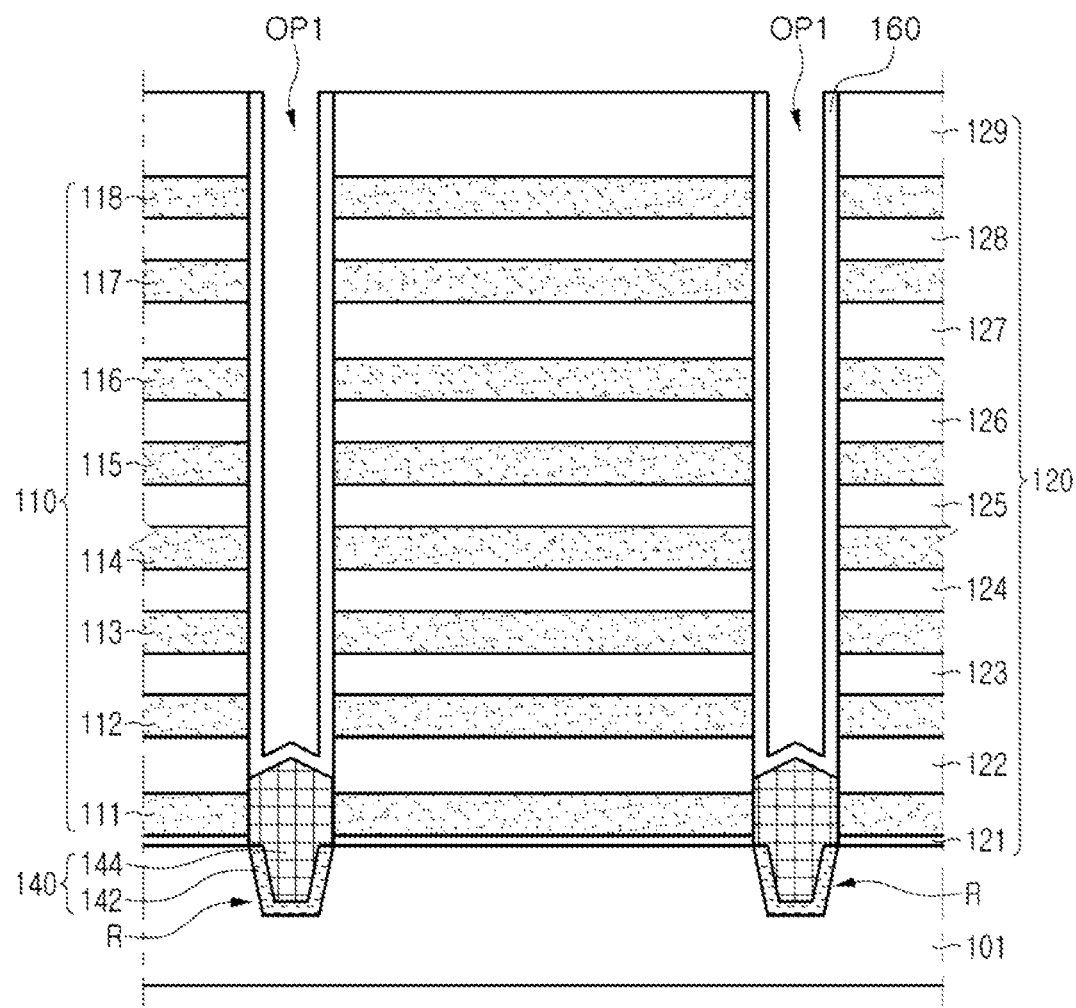

Referring to FIG. 11, gate dielectric layers 160 may be formed in the first openings OP1.

The gate dielectric layers 160 may be formed to have a uniform thickness using an atomic layer deposition (ALD) process or a chemical vapor deposition (CVD) process.

In this process, the gate dielectric layers 160 may be fully or partially formed, and may include portions extending perpendicular with respect to the substrate 101 along the channels 150, like the gate dielectric layers described with reference to FIGS. 5A to 5C.

Figure 12:
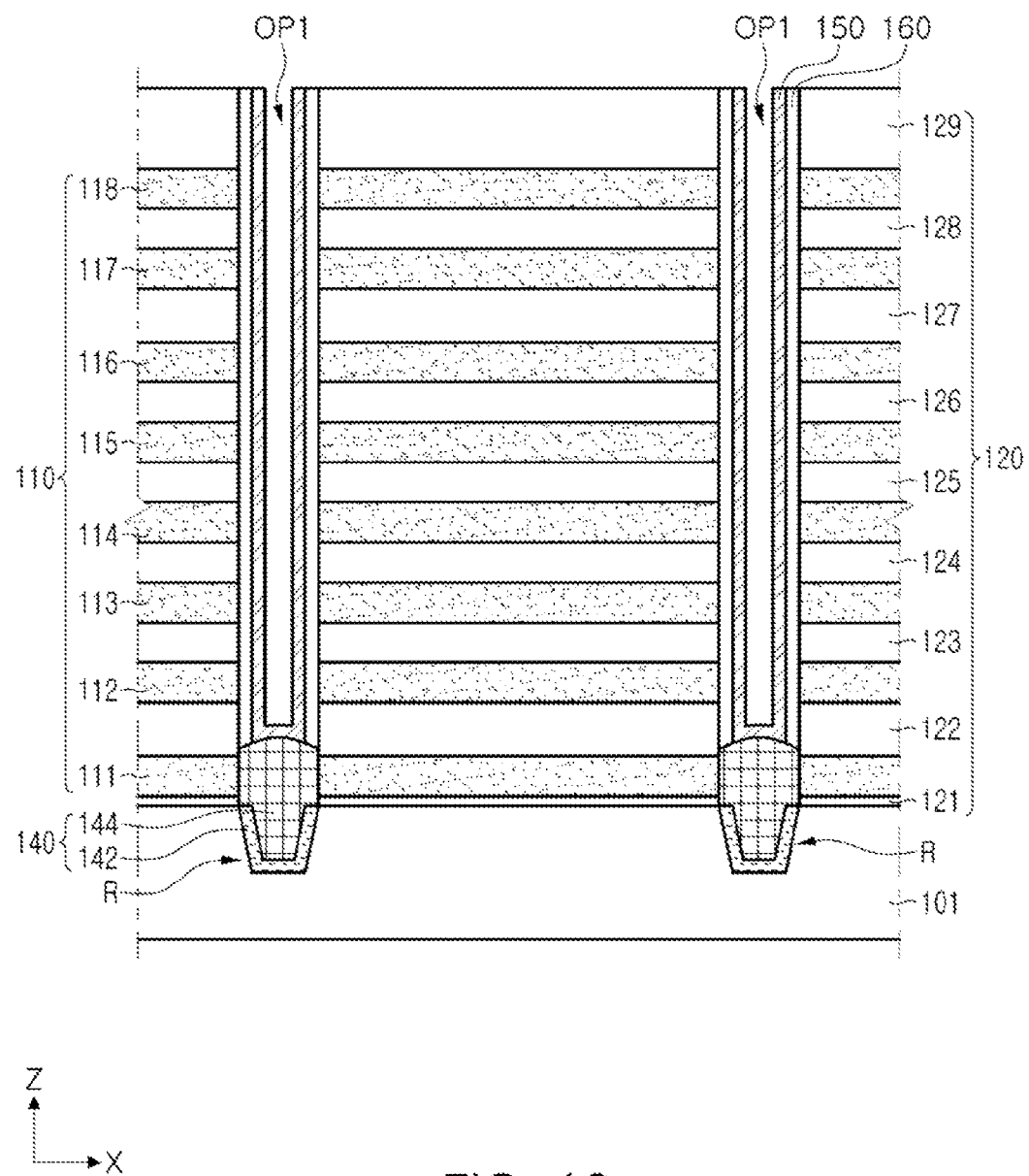

Referring to FIG. 12, portions of the gate dielectric layers 160 may be removed in the first openings OP1 to expose portions of the second epitaxial layers 144, and channels 150 may be formed on the exposed second epitaxial layers 144 and the gate dielectric layers 160.

In order for the channels 150 to be in direct contact with the second epitaxial layers 144, portions of the gate dielectric layers 160 formed on the upper surfaces of the second epitaxial layers 144 may be removed. When the portions of the gate dielectric layers 160 are removed, portions of the second epitaxial layers 144 may be removed. In addition, in example embodiments, recesses may be formed in upper portions of the second epitaxial layers 144.

The channels 150 may be in contact with the second epitaxial layers 144 on the upper surfaces of the second epitaxial layers 144.

Figure 13:
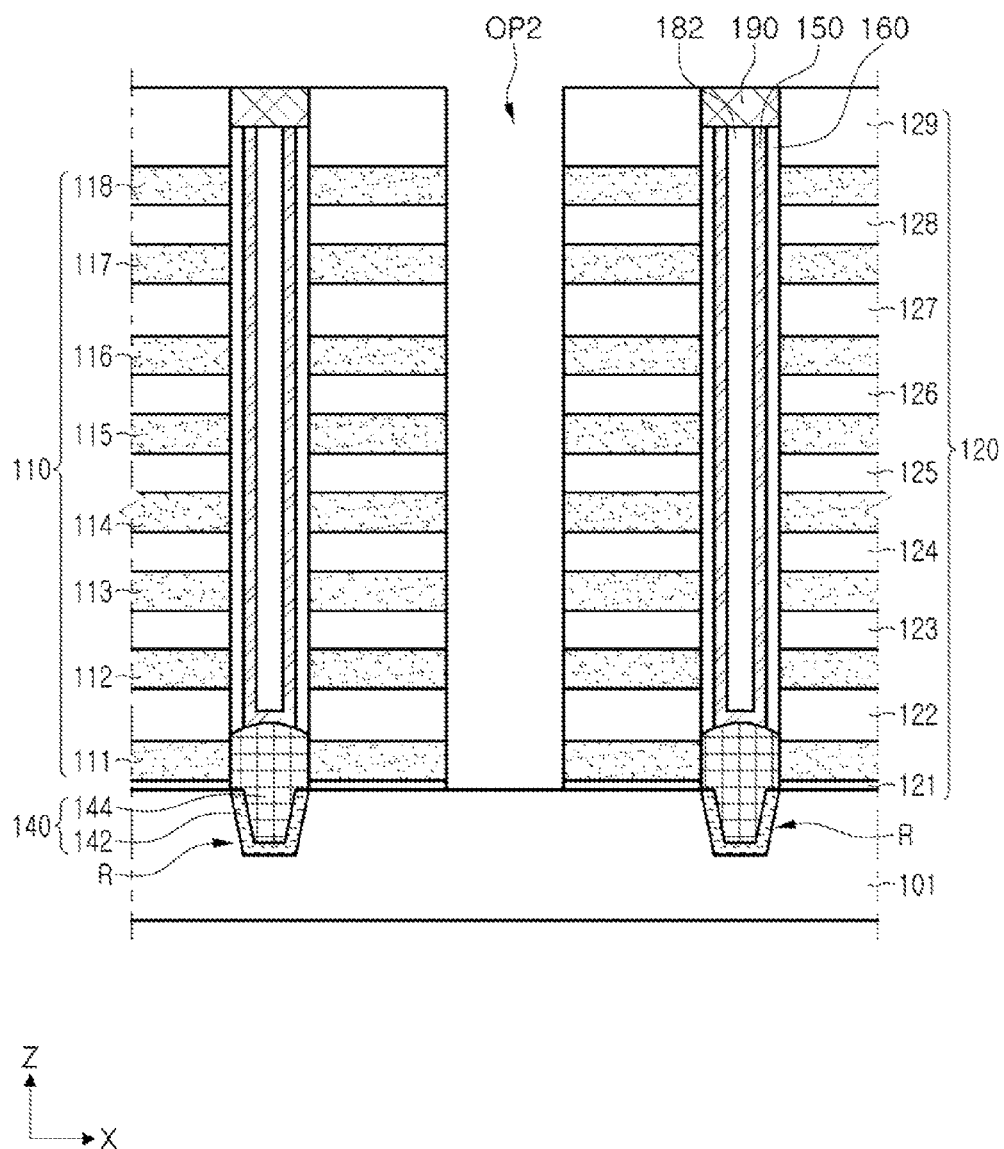

Referring to FIG. 13, first, first insulating layers 182 filling the first openings OP1, and drain pads 190 disposed on the first insulating layers 182 may be formed. Next, a second opening OP2 separating the stacked structure of the sacrificial layers 110 and the interlayer insulating layers 120 at a desired (and/or alternatively predetermined) distance may be formed.

The first insulating layers 182 may be an insulating material. However, in other embodiments, a conductive material instead of the first insulating layers 182 may fill a space between the channels 150.

The second opening OP2 may be formed by forming a mask layer using a photolithography process, and anisotropically etching the stacked structure of the sacrificial layers 110 and the interlayer insulating layers 120. The second opening OP2 may be formed in the form of a trench extending in the y-direction (refer to FIG. 4). In example embodiments, before the second opening OP2 is formed, an additional insulating layer may be formed on uppermost interlayer insulating layers 129 and the drain pads 190 to limit and/or prevent the drain pads 190 and the channels 150 disposed thereunder from being damaged. The second opening OP2 may expose the substrate 101 between the channels 150.

Figure 14:
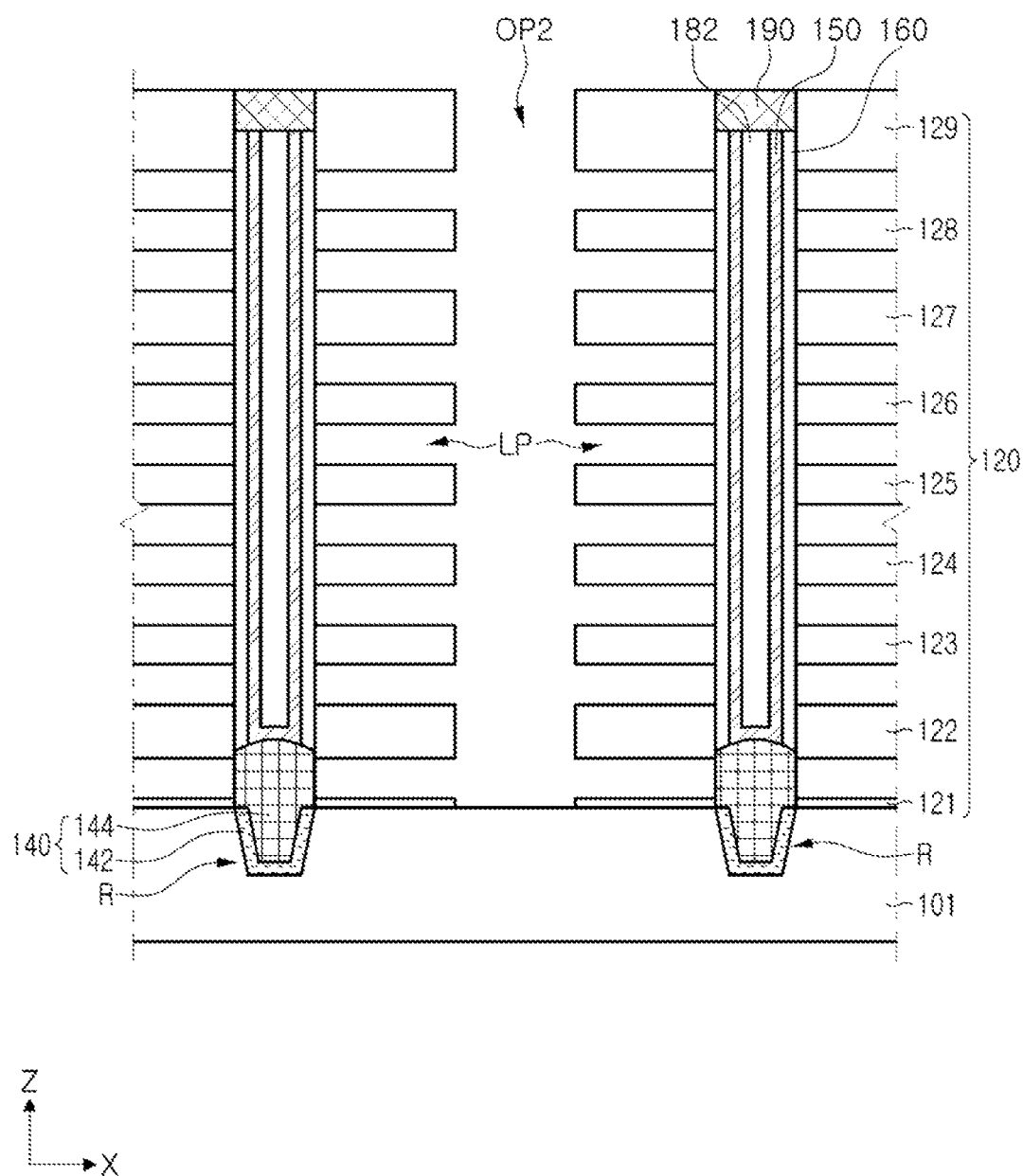

Referring to FIG. 14, the sacrificial layers 110 exposed through the second opening OP2 may be removed by an etching process, and accordingly a plurality of lateral openings LP defined between the interlayer insulating layers 120 may be formed. Through the lateral openings LP, portions of sidewalls of the gate dielectric layers 160 and second epitaxial layers 144.

When the above-described dummy channels are formed together with the channels 150 spaced apart by a desired (and/or alternatively predetermined) distance, the interlayer insulating layers 120 may be supported by the dummy channels so as not to be bent after the sacrificial layers 110 are removed.

Figure 15:
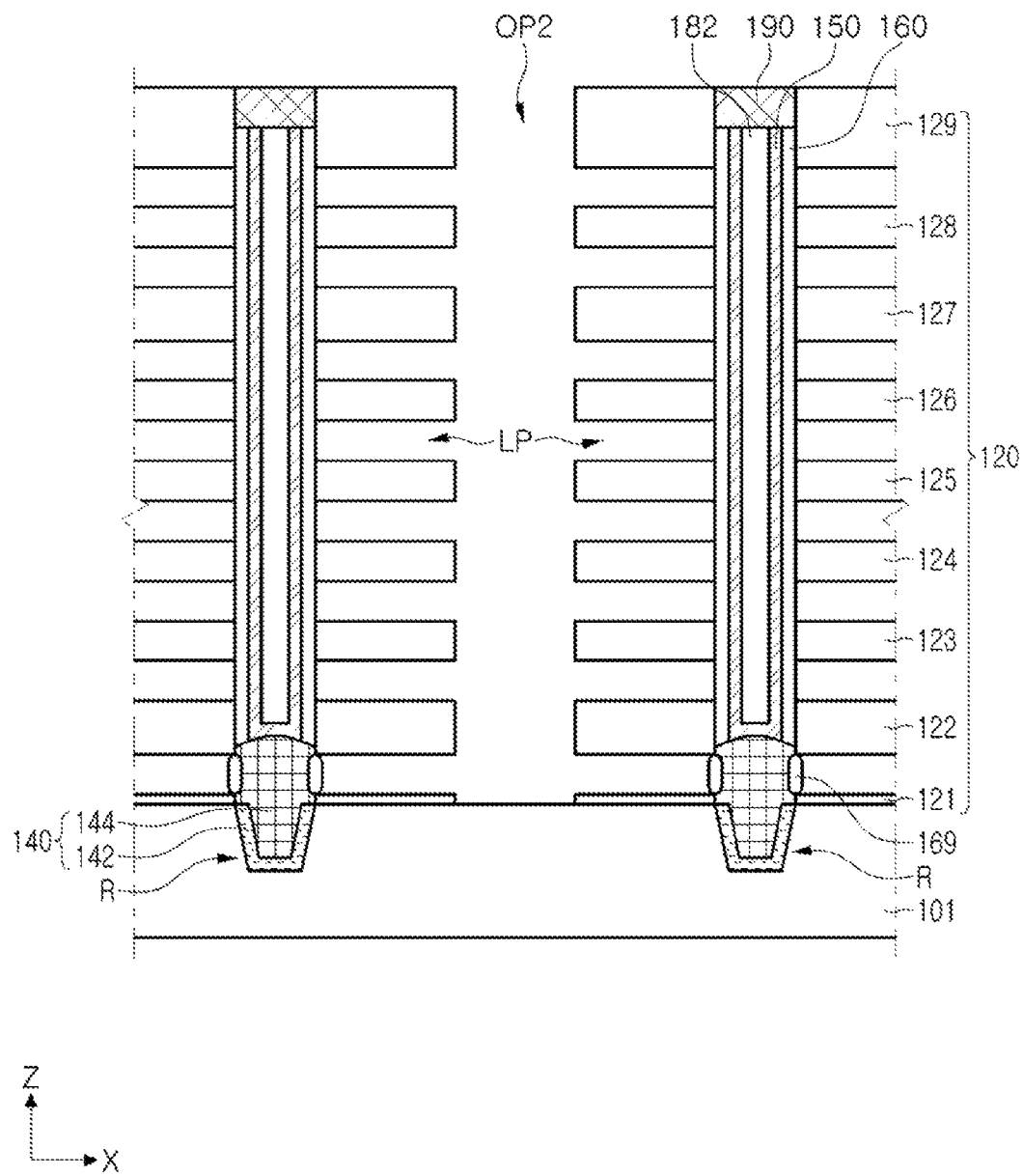

Referring to FIG. 15, epi-insulating layers 169 may be formed on the second epitaxial layers 144 exposed through the lateral openings LP.

The epi-insulating layers 169 may be formed, for example, by an oxidation process. In this case, the epi-insulating layers 169 may be oxide layers formed by the second epitaxial layers 144 being partially oxidized. A thickness and shape of the epi-insulating layers 169 are not limited to the thickness and shape illustrated in the drawings.

When the oxidation is performed in this process, the gate dielectric layers 160 exposed through the lateral openings LP may be partially oxidized and thereby damages generated during the etching process may be cured.

Figure 16:
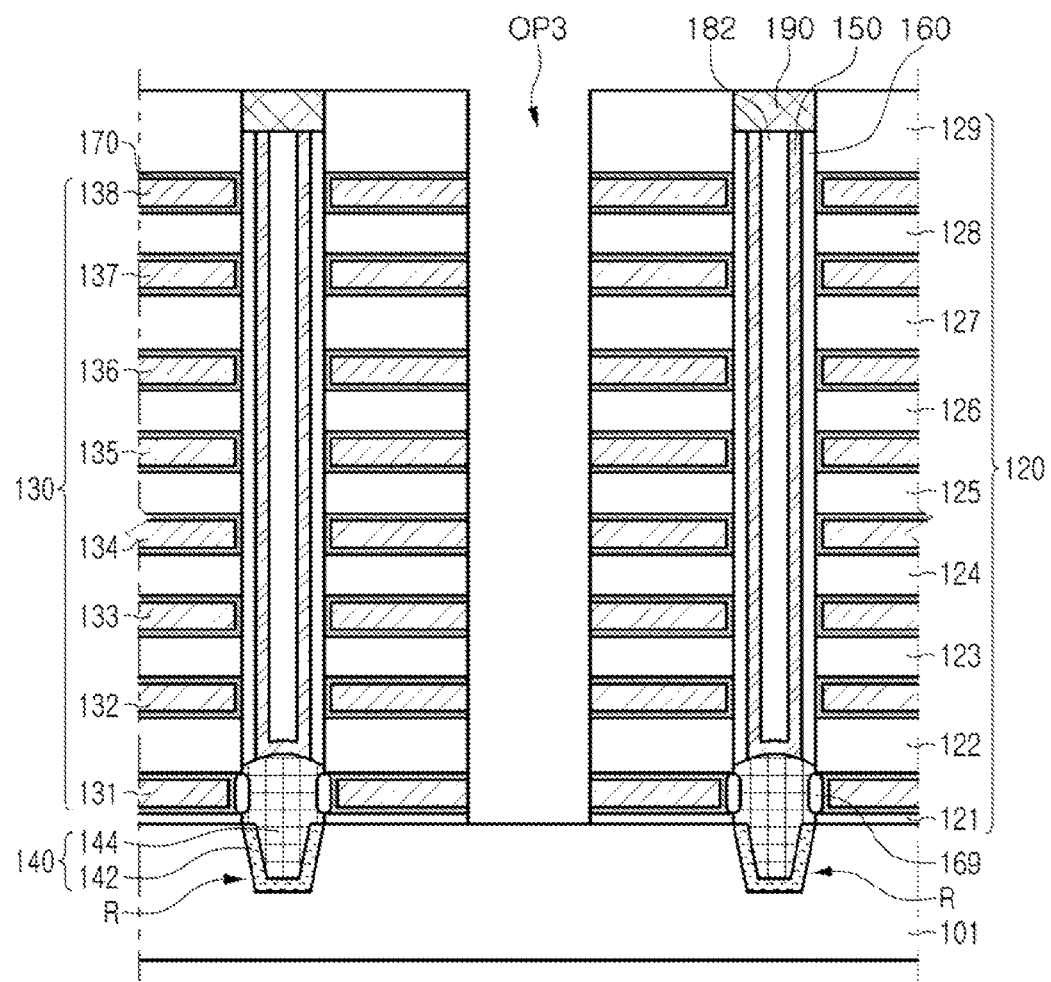

Referring to FIG. 16, diffusion barrier layers 170 and gate electrodes 130 may be formed in the lateral openings LP.

First, the diffusion barrier layers 170 may be formed to uniformly cover the gate dielectric layers 160, the epi-insulating layers 169, and the substrate 101 exposed by the second opening OP2 and the lateral openings LP. Next, the gate electrodes 130 may be formed to fill the lateral openings LP. Although the diffusion barrier layers 170 are illustrated as being distinguished from the gate electrodes 130, considering that the diffusion barrier layers 170 are a conductive material and a different material layer from the gate electrodes 130, the diffusion barrier layers 170 may be functionally a part of the gate electrodes 130. In addition, in example embodiments, the diffusion barrier layers 170 may be omitted.

The gate electrodes 130 may include a metal, polycrystalline silicon, or a metal silicide material. The metal silicide material may be, for example, a silicide material formed of a metal selected from Co, Ni, Hf, Pt, W, and Ti. When the gate electrodes 130 are formed of a metal silicide material, the gate electrodes 130 may be formed by filling the lateral openings LP with Si, forming a separate metal layers, and performing a silicidation process.

In the case that defects such as voids are formed in the epitaxial layers 140, failures such as leakage currents may occur since oxidation occurs within the voids during the formation of the epi-insulating layers 169. In addition, a conductive material forming the gate electrodes 130 may be formed along the voids in this process, resulting in generation of failures. However, according to example embodiments, since the second epitaxial layers 144 are formed after the first epitaxial layers 142 are formed, the generation of voids may be significantly reduced. Thus, such failures may also be limited and/or prevented.

Next, a third opening OP3 may be formed by removing the diffusion barrier layers 170 and the gate electrodes 130 formed in the second opening OP2 through an additional process so that the diffusion barrier layers 170 and the gate electrodes 130 are formed only in the lateral openings LP. The third opening OP3 may have the form of a trench extending in the y-direction (refer to FIG. 4). However, such a process may be performed in a later process.

Figure 17:
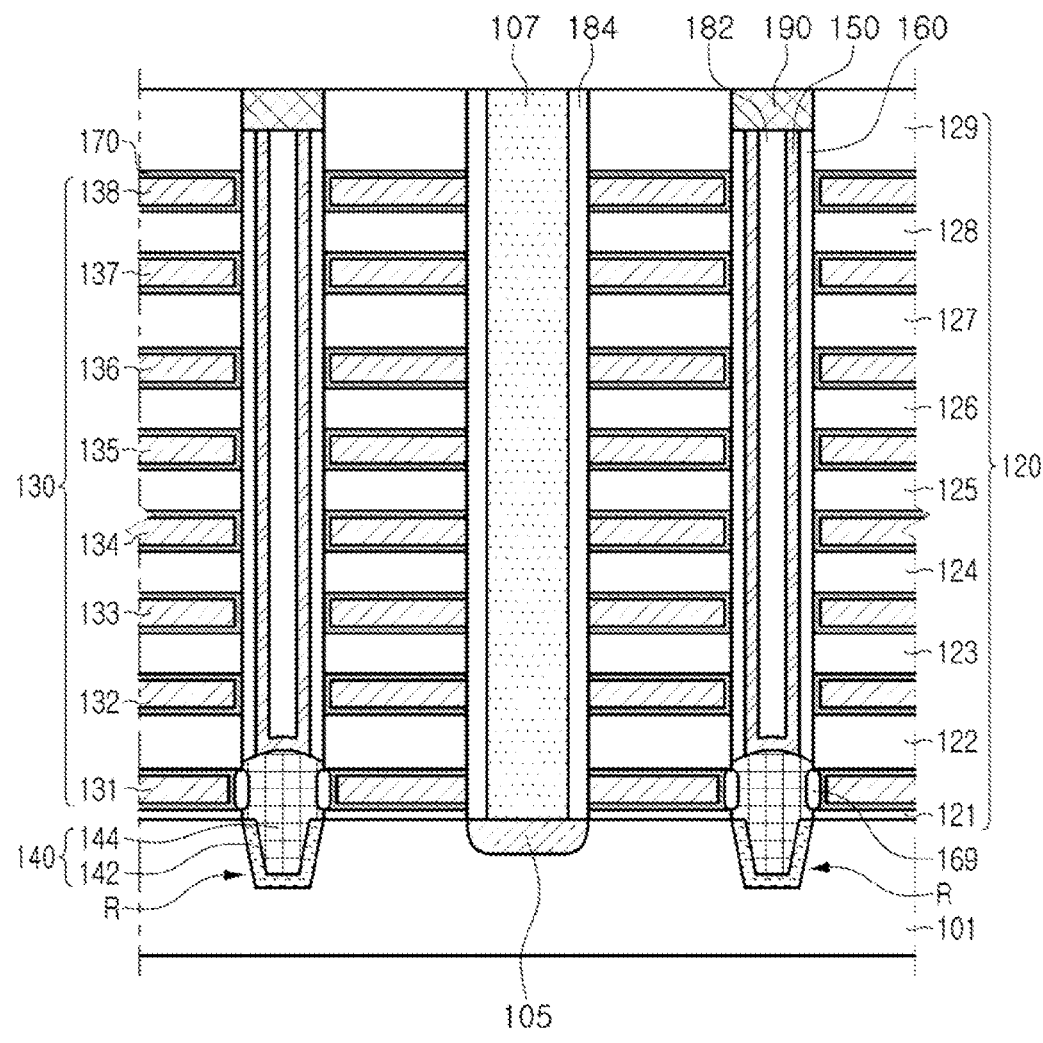

Referring to FIG. 17, a source region 105 may be formed on the substrate 101 in the third opening OP3, and a common source line 107 and second insulating layers 184 may be formed on the source region 105.

First, the source region 105 may be formed by injecting impurities into the substrate 101 exposed by the third opening OP3. Next, the second insulating layers 184 may be formed on a sidewall of the third opening OP3, and the common source line 107 may be formed.

In example embodiments, the source region 105 may be formed after the second insulating layers 184 are formed. The source region 105 may be configured to include a high concentration region and low concentration regions disposed on both ends thereof.

Next, although not shown in the drawings, bit lines BL (refer to FIG. 3) connected to the drain pads 190 may be formed. The bit line BL may extend to connect the drain pads 190 arranged in the x-direction, and additional contact plugs may be further disposed between the bit lines BL and the drain pads 190.

Figure 18:
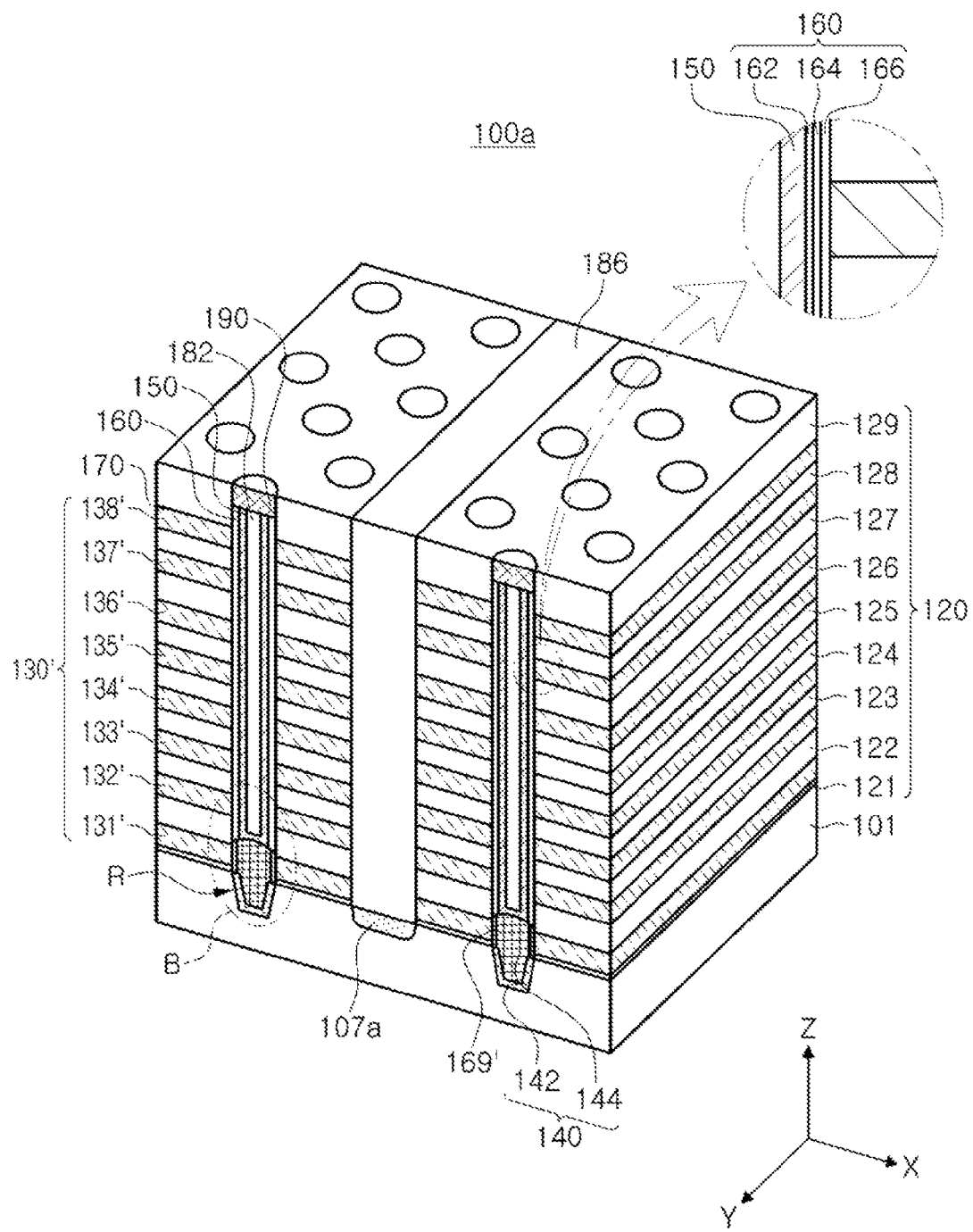
FIG. 18 is a perspective view schematically illustrating a structure of memory cell strings of a semiconductor device according to example embodiments.

FIG. 18 is a perspective view schematically illustrating a structure of memory cell strings of a semiconductor device according to example embodiments.

Referring to FIG. 18, the semiconductor device 100a may include a substrate 101, a plurality of channels 150 disposed in a direction perpendicular with respect to an upper surface of the substrate 101, and a plurality of interlayer insulating layers 120 and a plurality of gate electrodes 130', stacked on outer sidewalls of the channels 150. The semiconductor device 100a may further include epitaxial layers 140 disposed on the substrate 101 under the channels 150, gate dielectric layers 160 disposed between the channels 150 and the gate electrodes 130', a common source line 107a, and drain pads 190 disposed on the channels 150.

The gate electrodes 130' may include polycrystalline silicon or a metal silicide material. The metal silicide material may be, for example, a silicide material formed of a metal selected from Co, Ni, Hf, Pt, W, and Ti.

The gate dielectric layers 160, as illustrated in the enlarged view of FIG. 18, may include a tunneling layer 162, a charge storage layer 164, and a blocking layer 166, sequentially stacked on the sequentially stacked on the channels 150. Epi-insulating layers 169' may be disposed between the second epitaxial layers 144 and gate electrodes 131' adjacently to the second epitaxial layers 144. In example embodiments, a surface of the epi-insulating layers 169', in contact with the gate electrodes 131', may be coplanar with the gate dielectric layers 160.

Since the semiconductor device 100a according to example embodiments is fabricated in a different process from the semiconductor device 100 according to example embodiments with reference to FIG. 4, the whole gate dielectric layers 160 may vertically extend along the channels 150, and each of the gate electrodes 130' may be disposed to be in direct contact with the interlayer insulating layers 120 disposed thereon and therebelow. That is, the diffusion barrier layers 170 illustrated in FIG. 4 or the structure of the gate dielectric layers 160a and 160b illustrated in FIGS. 5B and 5C may not applied to the semiconductor device 100a.

The common source line 107a, unlike the common source line 107 of FIG. 4, may not be disposed on the substrate 101 but be disposed in the substrate 101 at a desired (and/or alternatively predetermined) depth to be adjacently to the upper surface of the substrate 101. The common source line 107a may be an impurity-doped area and extend in the y-direction. A third insulating layer 186 may be disposed on the common source line 107a.

Figure 19A:
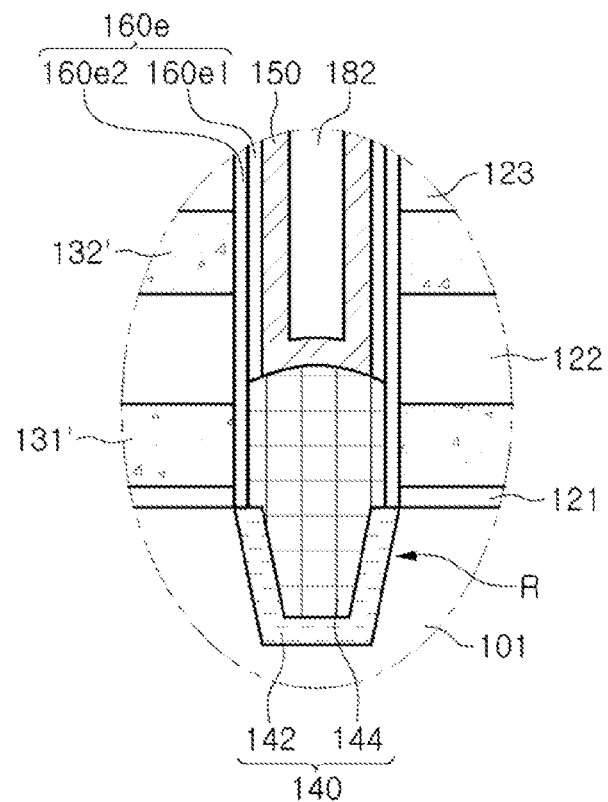
FIGS. 19A to 19C are cross-sectional views illustrating an epitaxial layer according to example embodiments, that is, illustrating an area corresponding to area "B" of FIG. 4.
Figure 19B:
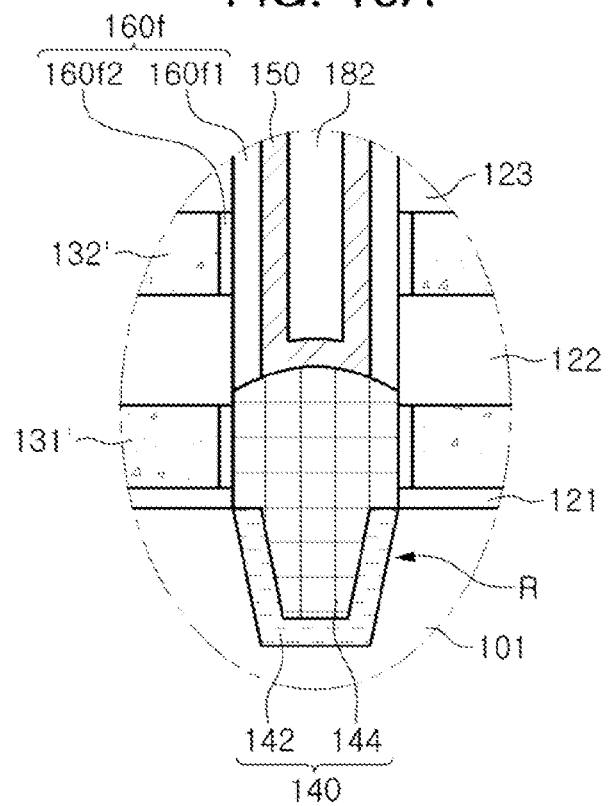
Figure 19C:
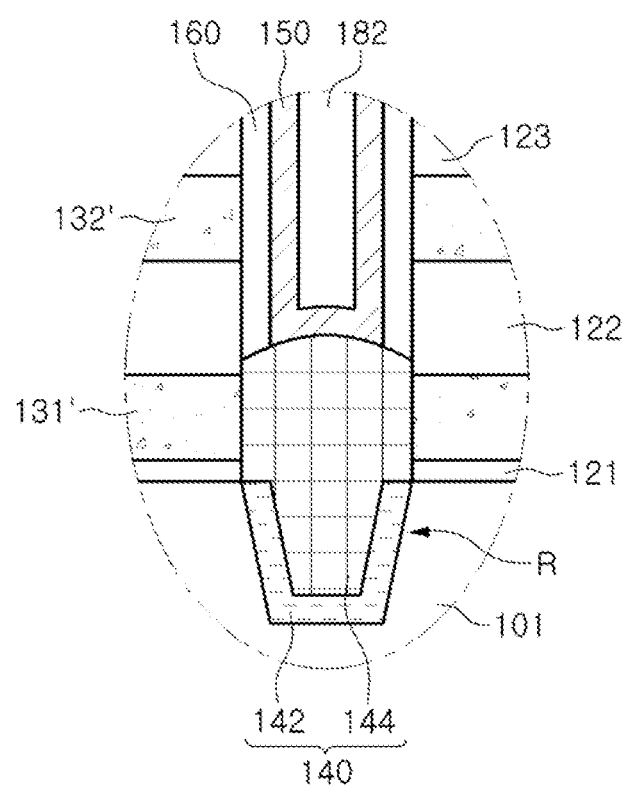

FIGS. 19A to 19C are cross-sectional views illustrating an epitaxial layer according to example embodiments, that is, illustrating an area corresponding to area "B" of FIG. 18.

In FIG. 19A, epitaxial layers 140, channels 150, gate dielectric layers 160e, and gate electrodes 131' disposed on a side surface of second epitaxial layers 144 are illustrated.

In example embodiments, the gate dielectric layers 160e may include first layers 160e1 and second layers 160e2, unlike the gate dielectric layers 160 in FIG. 18. The first layers 160e1 may only be disposed on the second epitaxial layers 144, and the second layers 160e2 may extend under the first layers 160e1 to be in contact with the substrate 101. The second layers 160e2 may extend to cover side surfaces of the second epitaxial layers 144, and may be disposed between second epitaxial layers 144 and gate electrodes 131'. Accordingly, portions of the second layers 160e2, disposed between the second epitaxial layers 144 and the gate electrodes 131' may function as gate insulating layers of the ground select transistor GST, similar to the epi-insulating layers 169' of FIG. 18.

In FIG. 19B, epitaxial layers 140, channels 150, gate dielectric layers 160f, and gate electrodes 131' disposed on second epitaxial layers 144 are illustrated.

In example embodiments, the gate dielectric layers 160f may include first layers 160f1 and second layers 160f2, unlike the gate dielectric layers 160 and 160e in FIGS. 18 and 19A. The first layers 160f1 may be disposed on the second epitaxial layers 144, and the second layers 160f2 may be disposed on side surfaces of the gate electrodes 130'. The second layers 160f2 may be oxide layers formed by partially oxidizing the gate electrodes 130'. Accordingly, portions of the second layers 160f2, disposed between the second epitaxial layers 144 and the gate electrodes 131' may function as gate insulating layers of the ground select transistor GST, similar to the epi-insulating layers 169' of FIG. 18.

In FIG. 19C, epitaxial layers 140, channels 150, gate dielectric layers 160, and gate electrodes 131' disposed on side surfaces of second epitaxial layers 144 may be formed.

According example embodiments, the second epitaxial layers 144 may be in direct contact with the gate electrodes 131'. That is, insulating layers may not be disposed between the second epitaxial layers 144 and the gate electrodes 131'. In such a case, the ground select transistors GST may use interlayer insulating layers 121 disposed between the gate electrodes 131' and the substrate 101 as gate dielectric layers.

FIGS. 20 to 27 are diagrams schematically illustrating main processes of a method of fabricating a semiconductor device according to example embodiments. Hereinafter, different parts from method described above with reference to FIGS. 7 to 17 will be mainly described.

Figure 20:
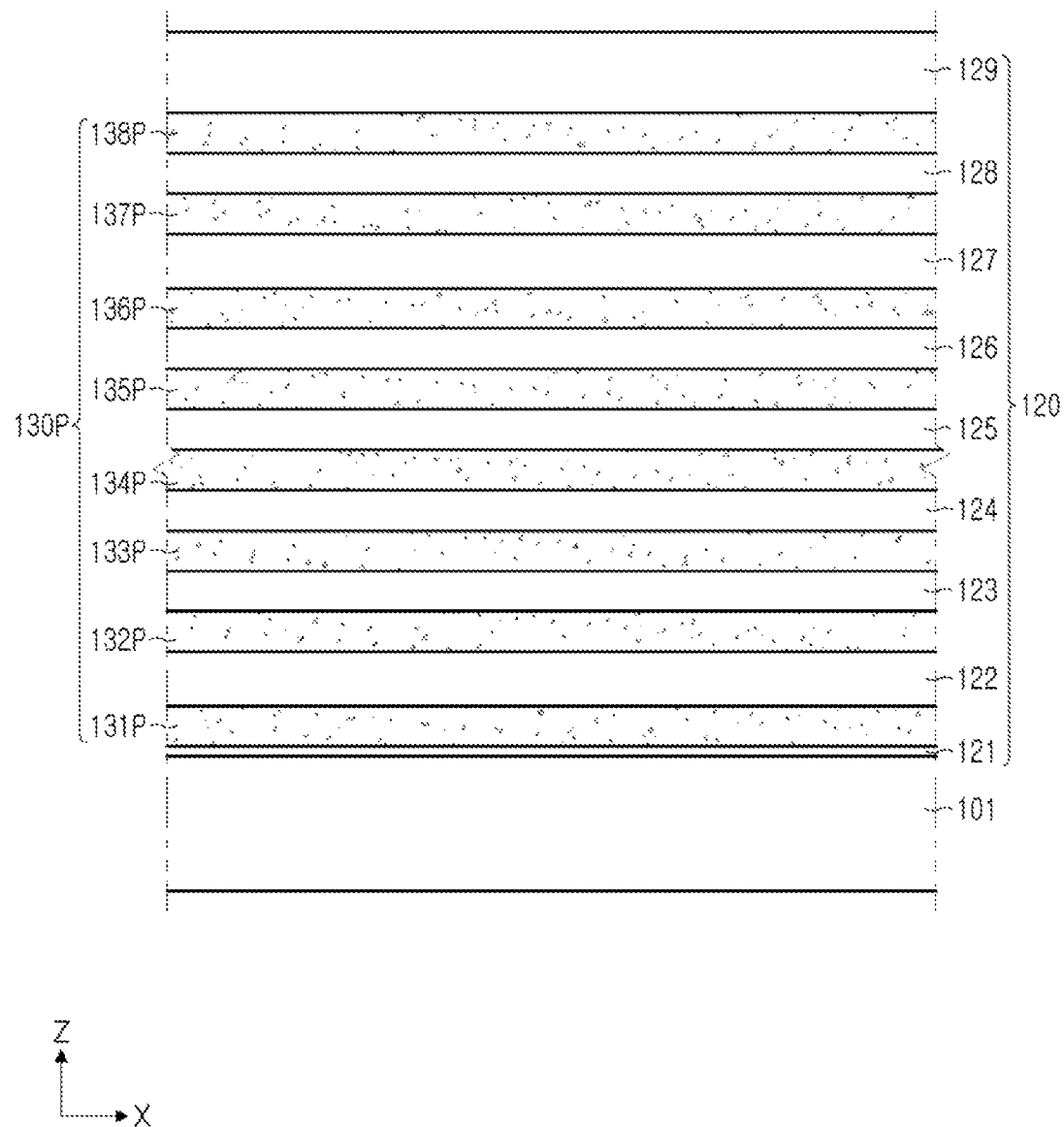
FIGS. 20 to 27 are diagrams schematically illustrating main processes of a method of fabricating a semiconductor device according to example embodiments.

Referring to FIG. 20, a plurality of interlayer insulating layers 120 and a plurality of gate conductive layers 131P to 137P collectively represented by 130P may be alternately stacked on a substrate 101. The gate conductive layers 130P in this process, unlike the gate electrodes 130' of FIG. 18, may be formed of, for example, polycrystalline silicon before a metal silicide is formed. The interlayer insulating layers 120 may be, for example, at least one of silicon oxide layer and silicon nitride layer.

Figure 21:
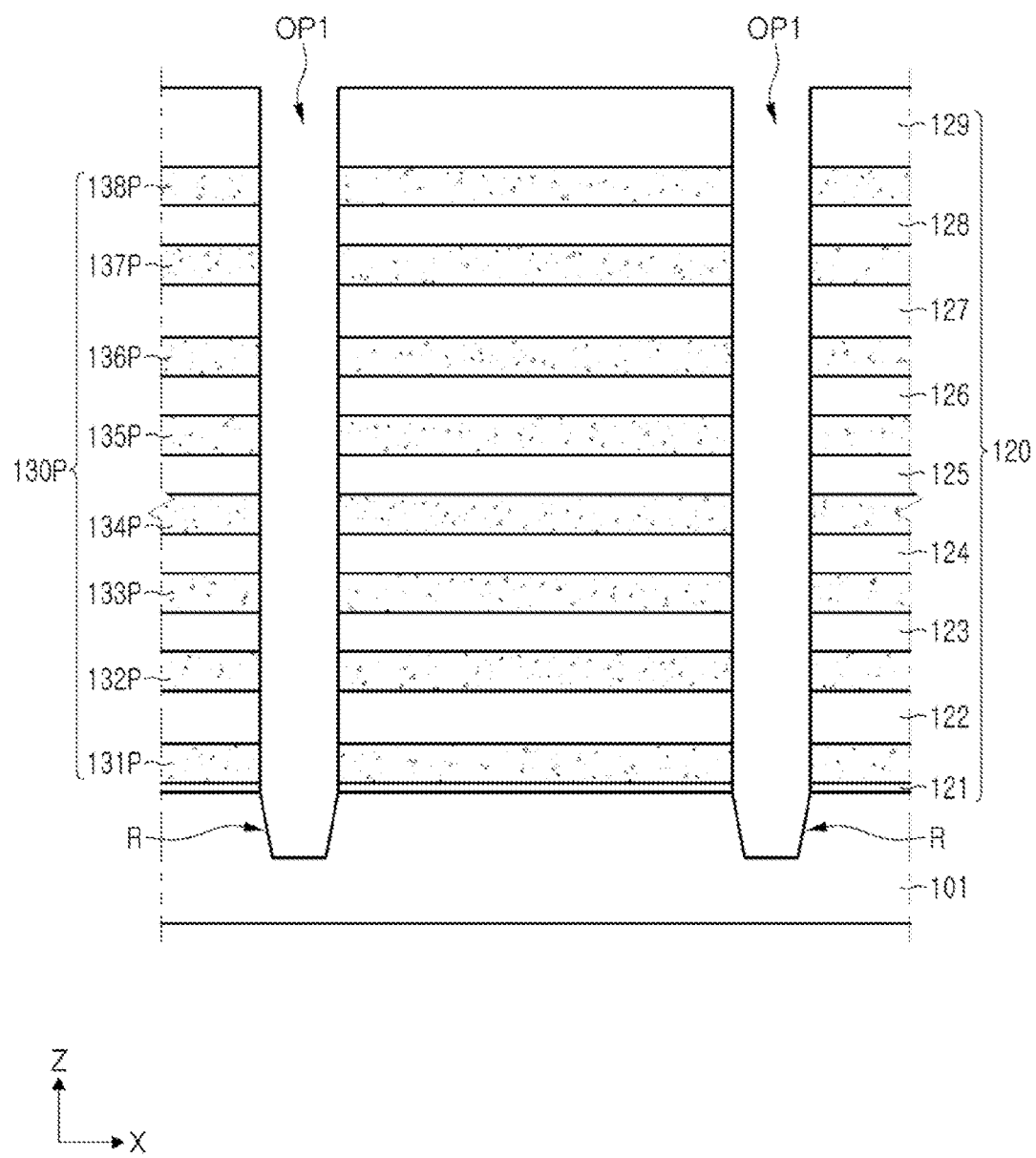

Referring to FIG. 21, hole-type first openings OP1 passing through the gate conductive layers 130P and the interlayer insulating layers 120 may be formed. The gate conductive layers 130P may also referred to as intermediate layers.

The first openings OP1 may extend to the substrate 101 in the z-direction to form recessed regions R in the substrate 101. The first openings OP1 may be formed by anisotropically etching the gate conductive layers 130P and the interlayer insulating layers 120. Since a stacked structure including two different kinds of layers is etched, sidewalls of the first openings OP1 may not be perpendicular with respect to an upper surface of the substrate 101. For example, a width of the first openings OP1 may decrease toward the upper surface of the substrate 101.

Figure 22:
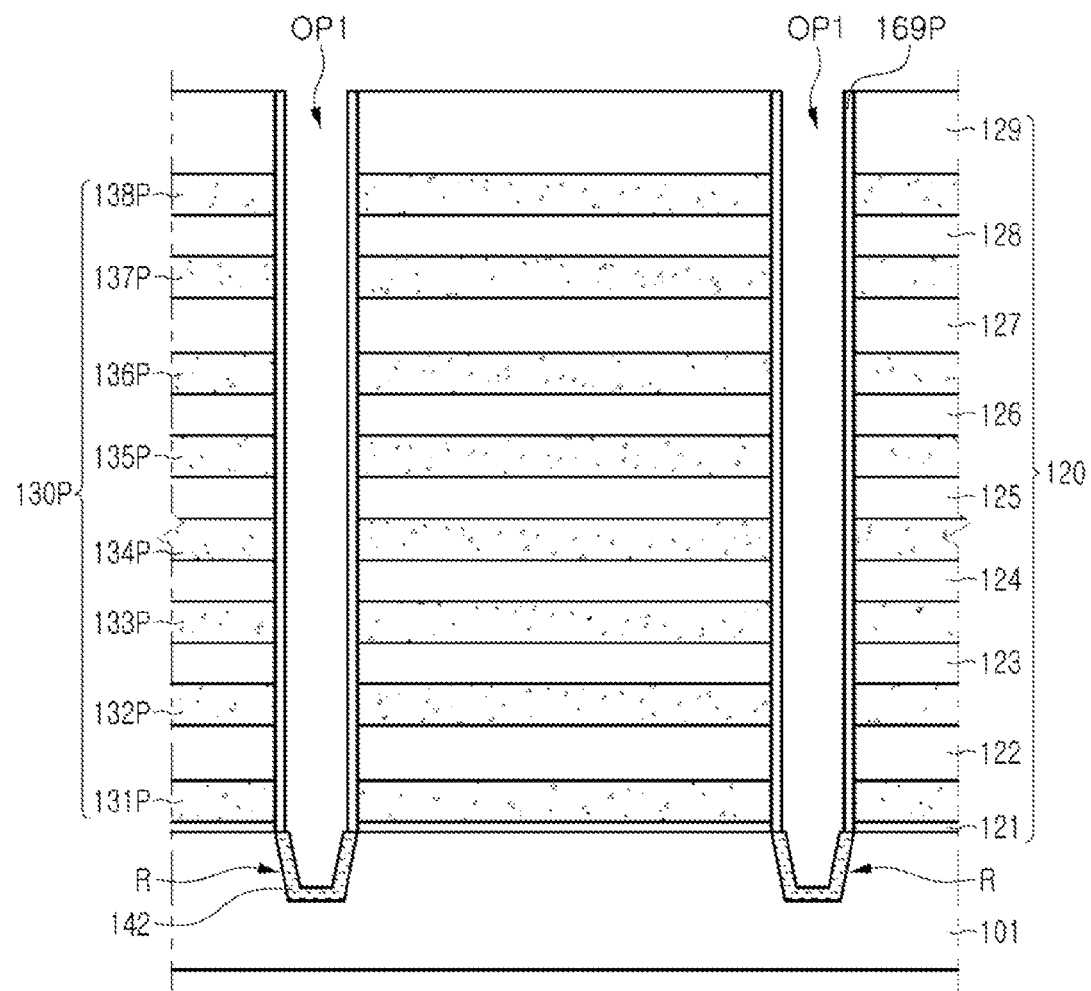

Referring to FIG. 22, first epitaxial layers 142 may be formed in the recessed regions R under the first openings OP1, and preliminary epi-insulating layers 169P may be formed on the sidewalls of the first openings OP1 disposed on the recessed regions R.

The first epitaxial layers 142 may be formed using a method, the same as or a similar to that described above with reference to FIG. 9.

The preliminary epi-insulating layers 169P may be, for example, $SiO_2$, and may be formed in a deposition process. In example embodiments, when the preliminary epi-insulating layers 169P is formed in an oxidation process, the same structure as the second layers 160f2 described with reference to FIG. 19B may be formed. The preliminary epi-insulating layers 169P may be formed only on the sidewalls of the first openings OP1 by controlling process conditions thereof or removing the preliminary epi-insulating layers 169P formed on the first epitaxial layers 142 using a separate process.

Figure 23:
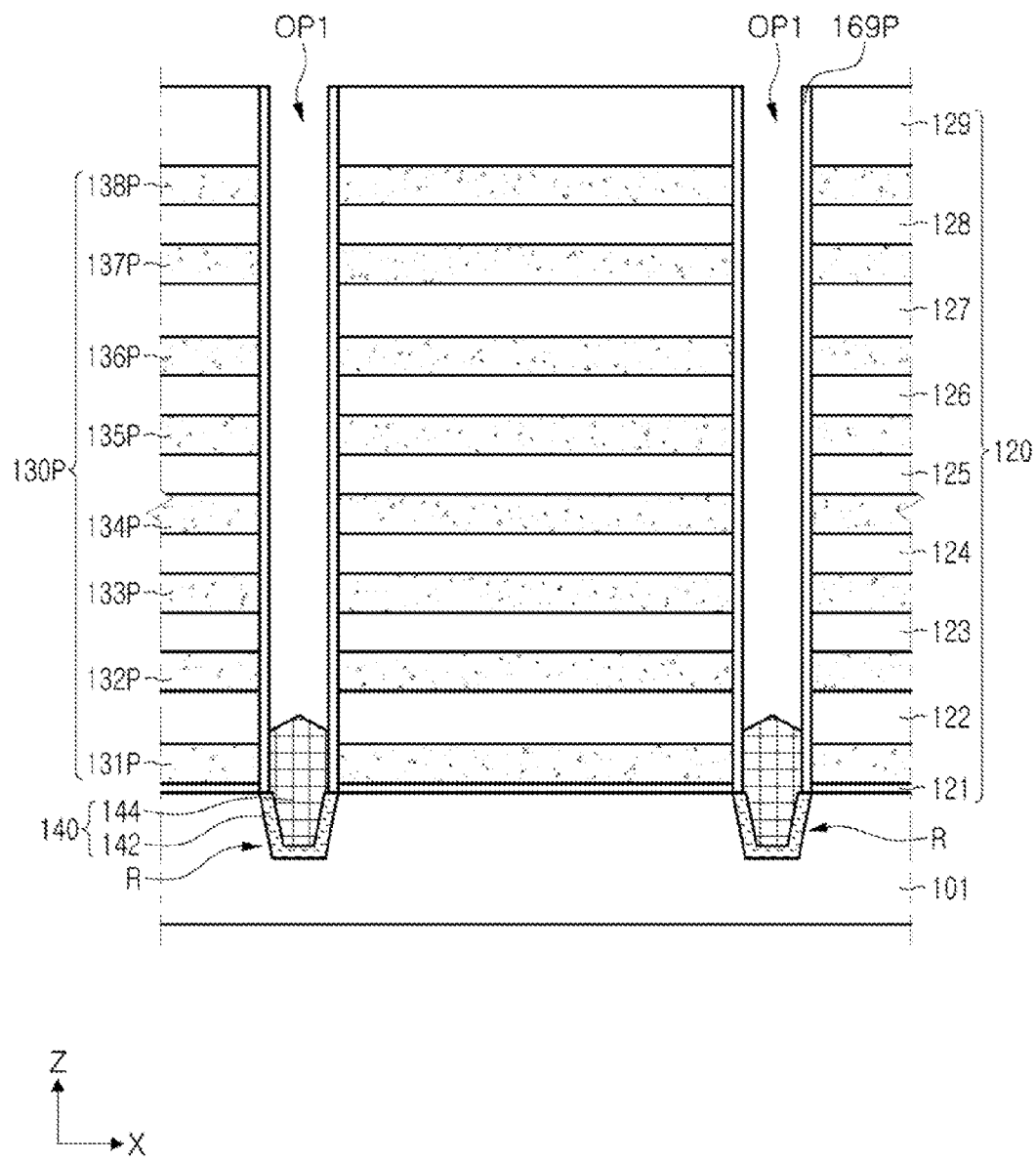

Referring to FIG. 23, second epitaxial layers 144 may be formed on the first epitaxial layers 142 disposed below the first openings OP1.

The second epitaxial layers 144 may be formed using a method, the same as or similar to that described above with reference to FIG. 10. The second epitaxial layers 144 may be grown from the first epitaxial layers 142 to extend to spaces between the preliminary epi-insulating layers 169P.

Figure 24:
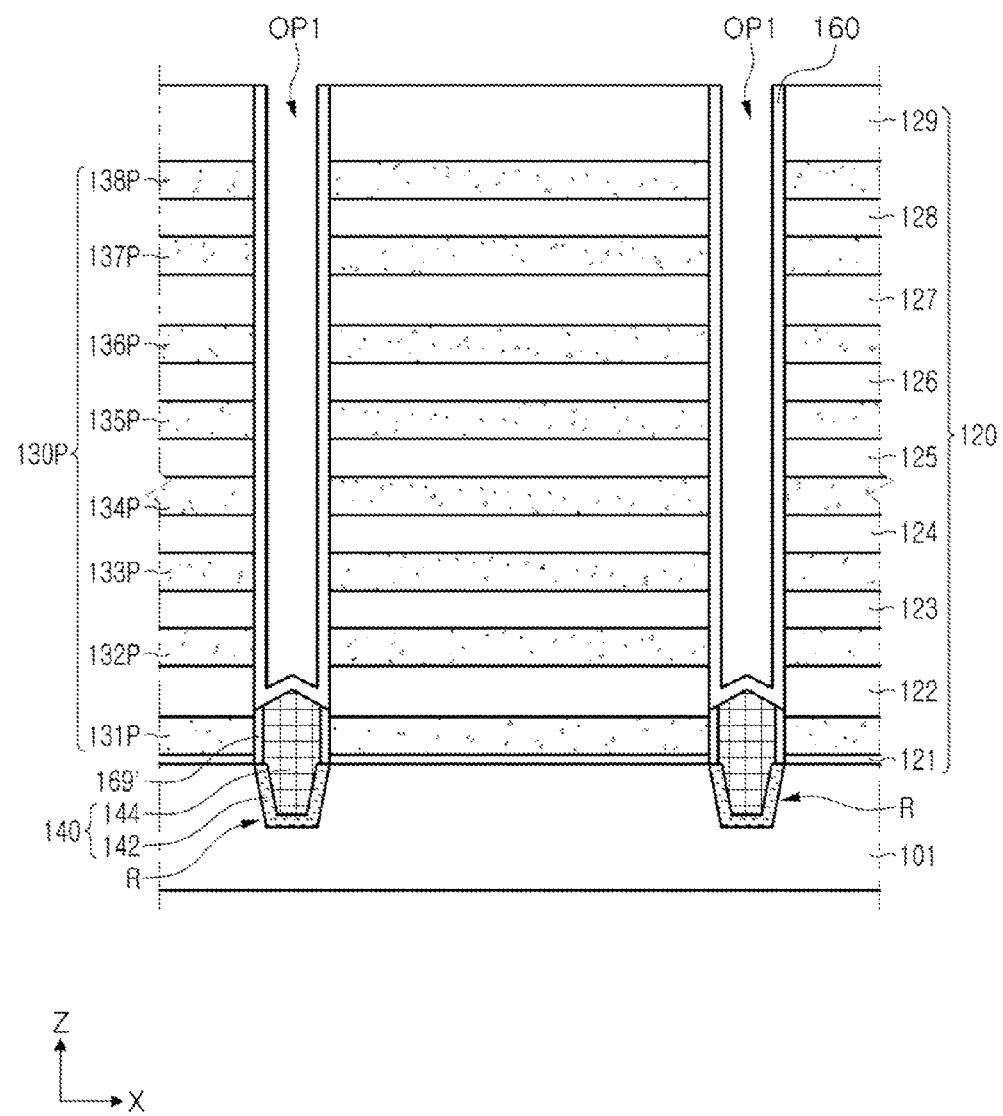

Referring to FIG. 24, the preliminary epi-insulating layers 169P disposed on the second epitaxial layers 144 may be removed to form gate dielectric layers 160.

The preliminary epi-insulating layers 169P may be removed by selectively etching exposed portions thereof on the second epitaxial layers 144. Thus, the epi-insulating layers 169' may be formed only on side surfaces of the second epitaxial layers 144. In example embodiments, when the gate dielectric layers 160 are formed without removing the preliminary epi-insulating layers 169P, the preliminary epi-insulating layers 169P may form the second layers 160e2 of FIG. 19A.

Figure 25:
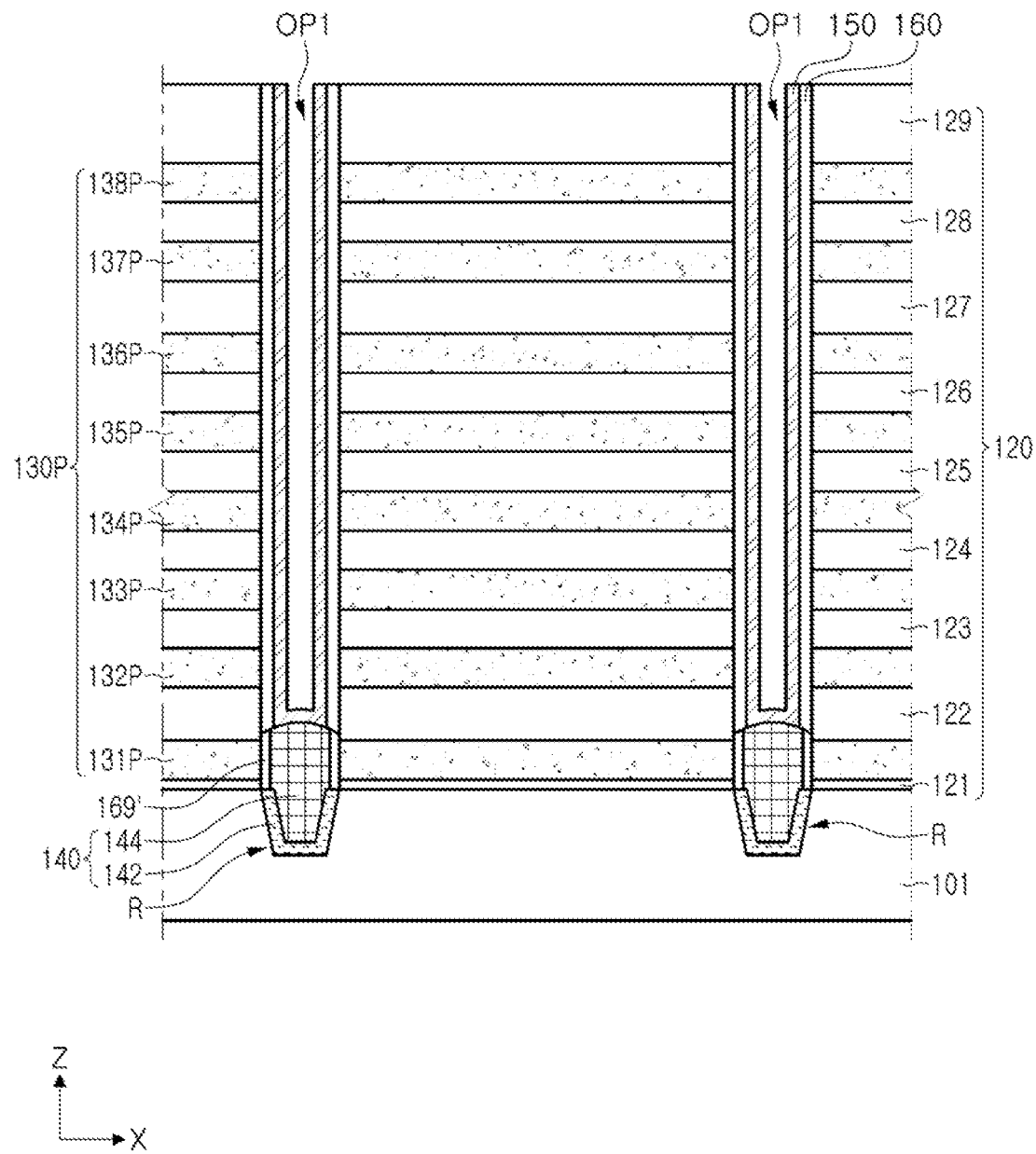

Referring to FIG. 25, portions of the gate dielectric layers 160 in the first openings OP1 may be removed to expose portions of the second epitaxial layers 144, and then channels 150 may be formed on the exposed second epitaxial layers 144 and the gate dielectric layers 160.

Figure 26:
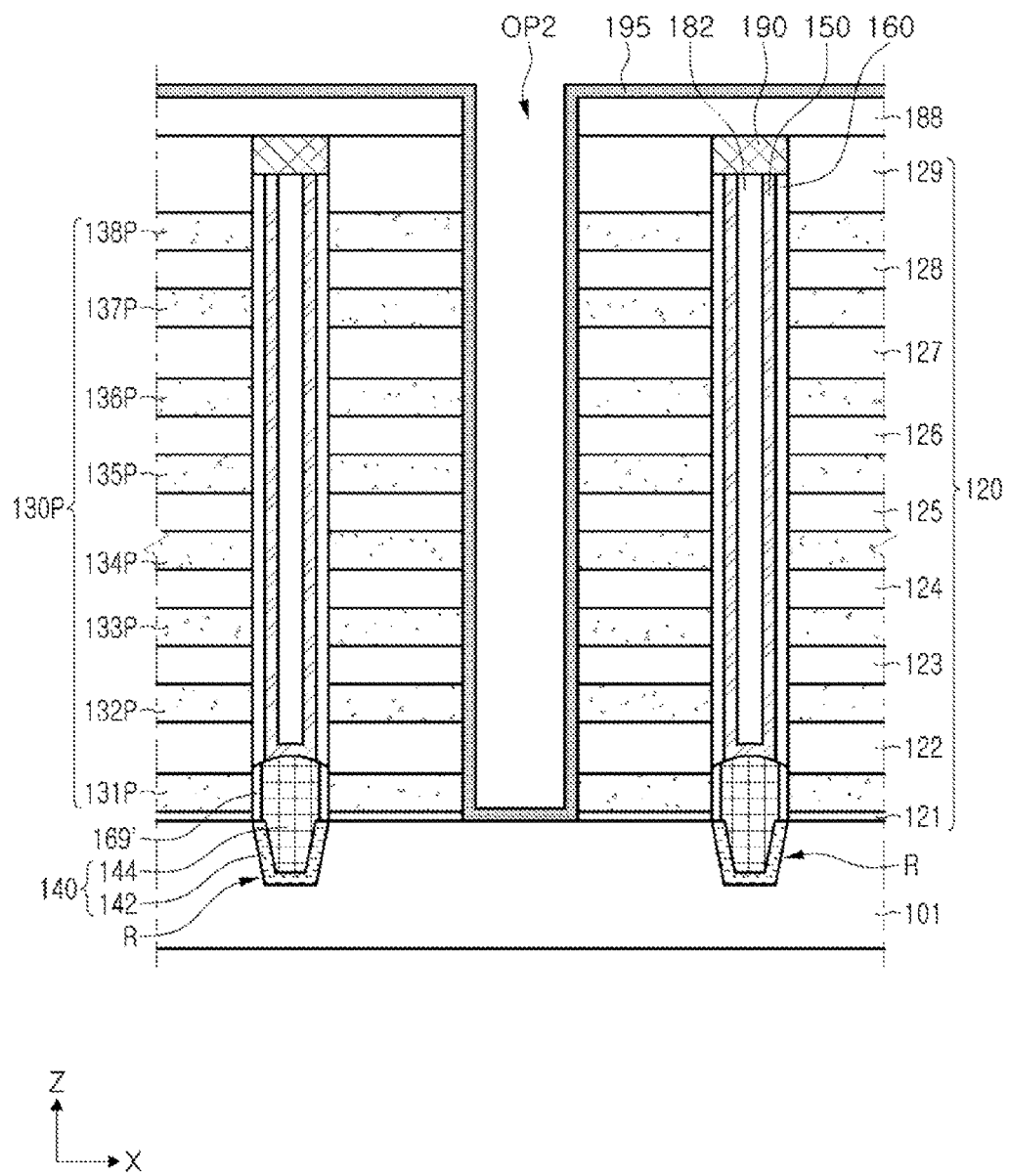

Referring to FIG. 26, first insulating layers 182 filling the first openings OP1, and drain pads 190 disposed on the first insulating layers 182 may be formed. Next, fourth insulating layers 188 protecting drain pads 190 may be formed, and then second opening OP2 separating the stacked structure of the sacrificial layers 110 and the interlayer insulating layers 120 in a desired (and/or alternatively predetermined) distance may be formed.

Next, a metal layer 195 may be formed in the second opening OP2 to cover side surfaces of the gate conductive layers 130P. Next, a process of siliciding the gate conductive layers 130P may be performed.

The metal layer 195 may be a material used to convert the gate conductive layers 130P formed of polycrystalline silicon into a metal silicide. The metal layer 195 may be, for example, a silicide material formed of a metal selected from Co, Ni, Hf, Pt, W, and Ti. After the metal layer 195 is formed, metals included in the metal layer 195 may be diffused, and then the gate conductive layers 130P may be subjected to silicidation to form the gate electrodes 130' of FIG. 18. Thus, resistance of the metal layer 195 may be reduced. After the silicidation process, the residual metal layer 195 may be removed.

Figure 27:
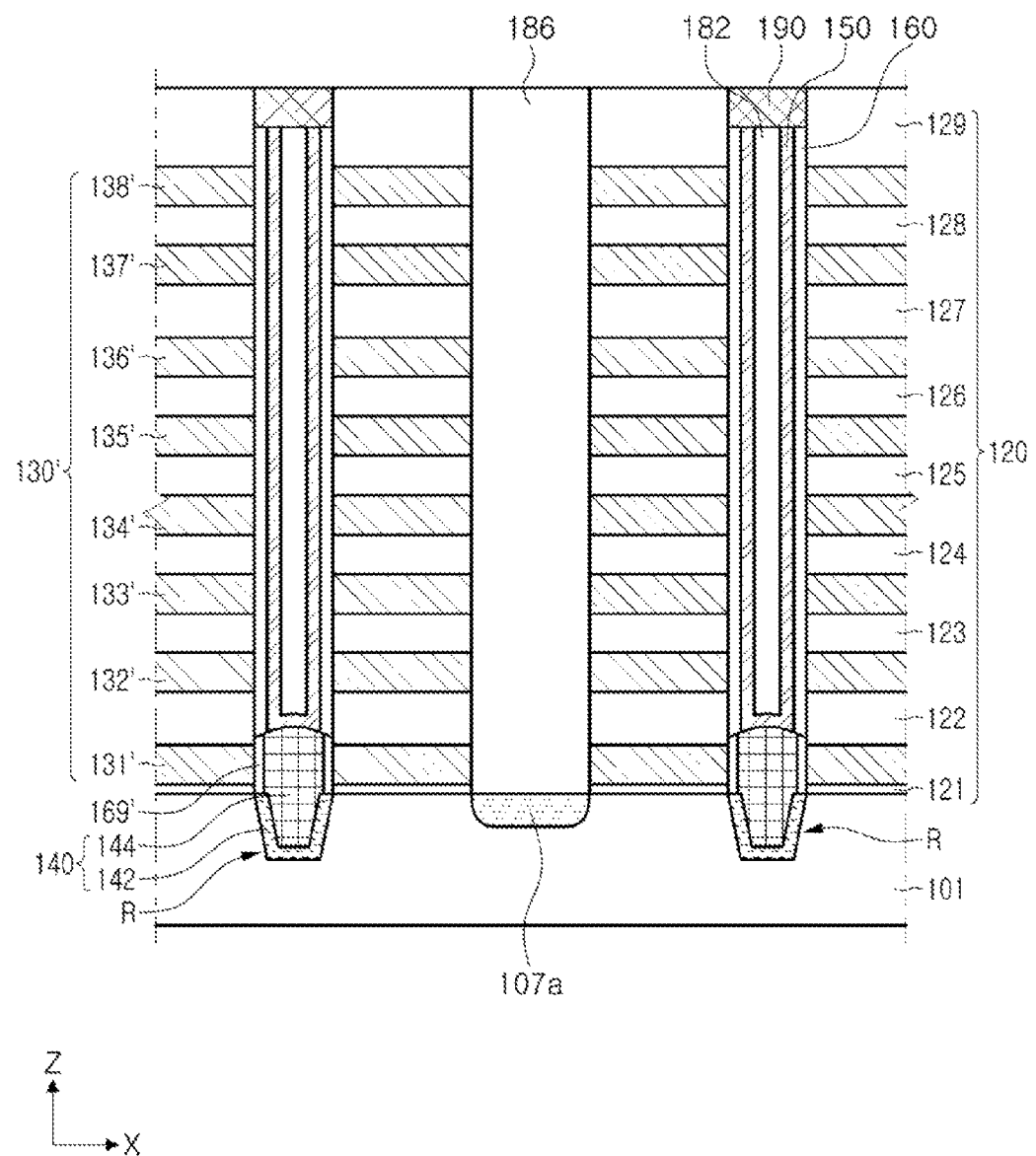

Referring to FIG. 27, a common source line 107a may be formed in the second opening OP2 disposed on the substrate 101, and a third insulating layer 186 may be formed thereon.

The common source line 107a may be formed by injecting impurities into the substrate 101 exposed through the second opening OP2. Next, although not shown in FIG. 27, bit lines BL (refer to FIG. 3) connected to the drain pads 190 may be formed.

Figure 28:
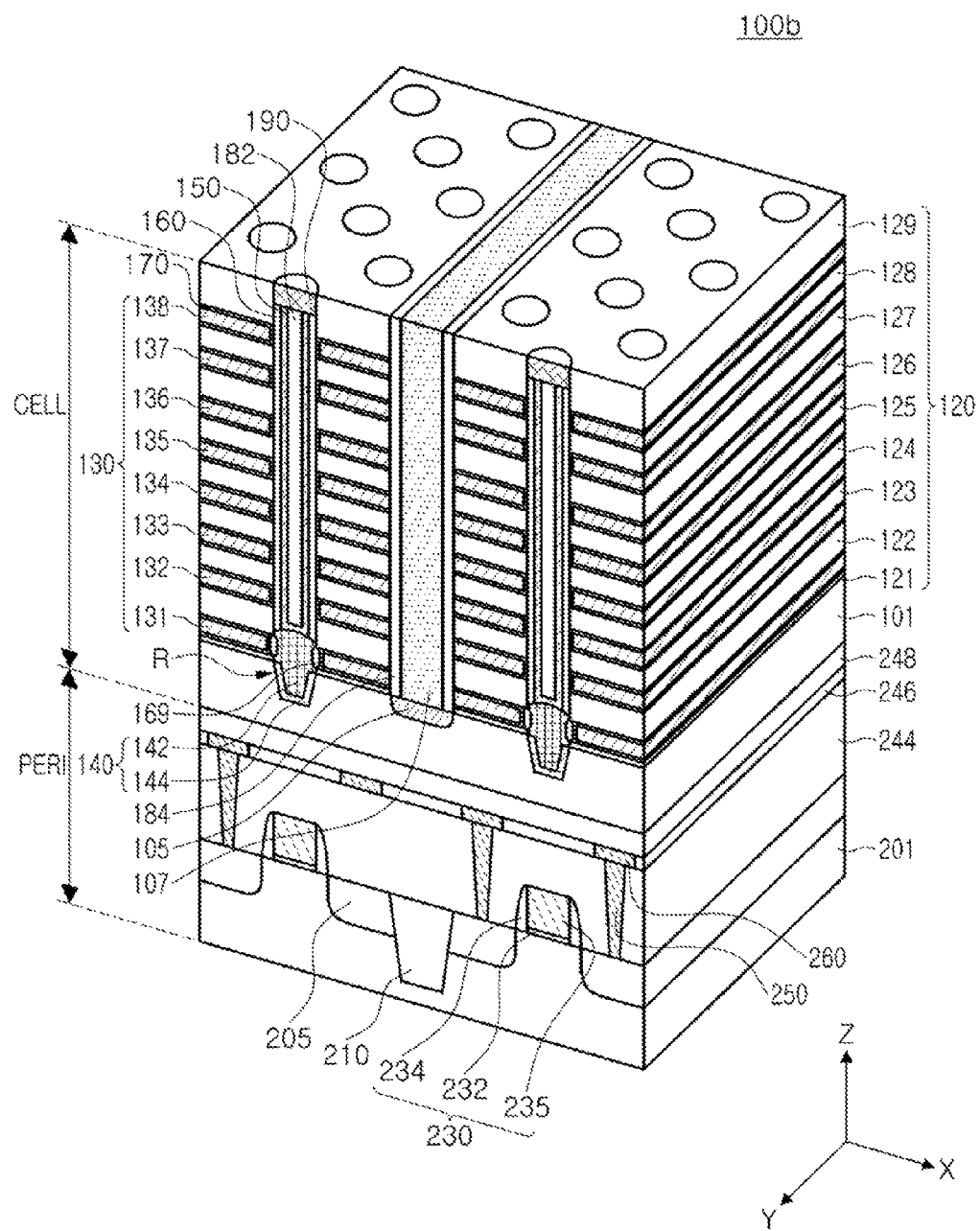
FIG. 28 is a schematic perspective view of a semiconductor device according to example embodiments.

FIG. 28 is a schematic perspective view of a semiconductor device according to example embodiments.

Referring to FIG. 28, a semiconductor device 100b may include a cell region CELL and a peripheral circuit region PERI.

The cell region CELL may correspond to a region in which the memory cell array 20 of FIG. 1 is disposed, and a peripheral circuit region PERI may correspond to a region in which the driving circuit 30 of the memory cell array 20 of FIG. 1 is disposed. The cell region CELL may be disposed on the peripheral circuit region PERI. In example embodiments, the cell region CELL may be disposed below the peripheral circuit region PERI.

The cell region CELL may include a substrate 101, a plurality of channels 150 disposed in a direction perpendicular with respect to an upper surface of the substrate 101, and a plurality of interlayer insulating layers 120 and a plurality of gate electrodes 130 stacked on outer sidewalls of the channels 150. The cell region CELL may further include epitaxial layers 140 disposed on the substrate 101 under the channels 150, gate dielectric layers 160 disposed between the channels 150 and the gate electrodes 130, common source line 107 disposed on the source region 105, and drain pads 190 disposed on the channels 150.

In example embodiments, the cell region CELL is illustrated as having the same structure as that in FIG. 4, but is not limited thereto. The cell region CELL may include, for example, semiconductor devices according to example embodiments, as described above with reference to FIGS. 5A to 6C, and FIGS. 18 to 19C.

The peripheral circuit region PERI may include, a base substrate 201, and circuit devices 230, contact plugs 250, and interconnection lines 260 disposed on the base substrate 201.

The base substrate 201 may include an upper surface extending in an x-direction and a y-direction. The base substrate 201 may include device isolation layers 210 to define active regions. Doped regions 205 including impurities may be disposed in portions of the active regions. The base substrate 201 may include a semiconductor material, for example, a group IV semiconductor, a Group III-V compound semiconductor, or Group II-VI oxide semiconductor. For example, The Group IV semiconductor may include silicon, germanium, or silicon-germanium. The base substrate 201 may be supplied as a bulk wafer or an epitaxial layer.

The circuit devices 230 may include planar transistors. Each of the circuit devices 230 may include a circuit gate insulating layer 232, a spacer layer 234, and a circuit gate electrode 235. Doped regions 205 may be disposed in base substrate 201 at both sides of the circuit gate electrode 235, and function as a source region or a drain region of the circuit device 230.

A plurality of peripheral insulating layers 244, 246, and 248 may be disposed on the circuit devices 230 on the base substrate 201. The peripheral insulating layer 244 may include a high density plasma (HDP) oxide layer in order to effectively fill a space between the plurality of circuit devices 230.

The contact plugs 250 may pass through the peripheral insulating layer 244 to be connected to the doped regions 205. Through the contact plugs 250, an electrical signal may be applied to the circuit devices 230. In a region not illustrated in the drawings, other contact plugs 250 may be connected to the circuit gate electrode 235 as well. The interconnection lines 260 may be connected to the contact plugs 250, and in example embodiments, may be disposed as a plurality of layers.

After the peripheral circuit region PERI is formed, and then the substrate 101 of the cell region CELL may be formed thereon to form the cell region CELL. The substrate 101 may have the same size as the base substrate 201, or smaller than the base substrate 201. The substrate 101 may be formed of polycrystalline silicon, or may be single-crystallized after formed of amorphous silicon.

The cell region CELL and the peripheral circuit region PERI may be connected in a region not illustrated in the drawings. For example, an end of the gate electrodes 130 in the y-direction may be electrically connected to the circuit devices 230.

The semiconductor device 100b according to example embodiments may be a small-sized apparatus since the cell region CELL and the peripheral circuit region PERI are vertically stacked.

Figure 29:
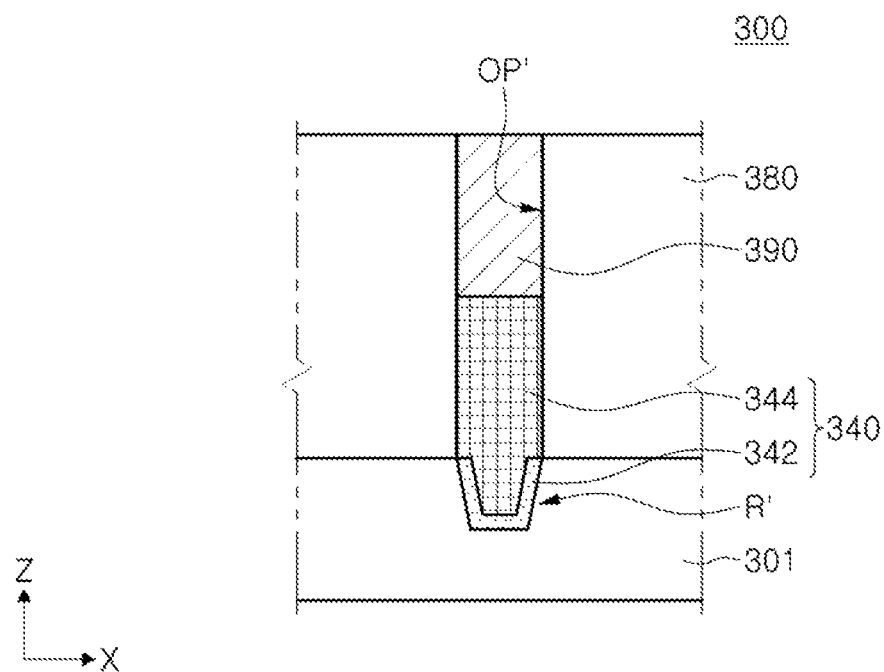
FIG. 29 is a schematic cross-sectional view of a semiconductor device according to example embodiments.

FIG. 29 is schematic cross-sectional view of a semiconductor device according to example embodiments.

Referring to FIG. 29, a semiconductor device 300 may include a substrate 301, and an insulating layer 380, an epitaxial layer 340, and a conductive layer 390, disposed on the substrate 301.

The substrate 301 may include a semiconductor material, for example, a Group IV semiconductor, a Group III-V compound semiconductor, or a Group II-VI oxide semiconductor. For example, the Group IV semiconductor may include silicon, germanium, or silicon-germanium. The substrate 301 may be provided as a bulk wafer or an epitaxial layer. In example embodiments, the substrate 301 may be a component of the semiconductor device 300 or include a component of the semiconductor device 300.

An opening OP' may be formed in the insulating layer 380. The opening OP' may have a hole shape or a line shape extending in a direction. The insulating layer 380 may be, for example, an interlayer insulating layer between components of the semiconductor device 300.

The epitaxial layer 340 may be disposed on a recessed region R' of the substrate 301 and include first and second epitaxial layers 342 and 344. The epitaxial layer 340 may be formed in an SEG process. The epitaxial layer 340 may include doped or undoped polycrystalline silicon, single crystalline silicon, polycrystalline germanium, or single crystalline germanium. For example, when the substrate 301 is single crystalline Si, the epitaxial layer 340 may also be single crystalline silicon. However, in example embodiments, even in the case that the substrate 301 is single crystalline Si, at least a portion of the epitaxial layer 340 may have a polycrystalline Si structure including a plurality of grains.

The first epitaxial layer 342 may be disposed on a recessed upper surface of the substrate 301 in the recessed region R'. The first epitaxial layer 342 may have a substantially uniform thickness, and may be disposed on the recessed surface of the substrate 301. In example embodiments, the first epitaxial layer 342 may not extend above the substrate 301, that is, higher than the upper surface of the substrate 301 in which the recessed region R' does not formed. However example embodiments are not limited thereto. The first epitaxial layer 342 may partially extend above the upper surface of the substrate 301, in example embodiments. The first epitaxial layer 342 may function as a seed layer for the second epitaxial layer 344. A density of the first epitaxial layer 342 may be higher than that of the second epitaxial layer 344. This is due to a difference in a process of forming the first and second epitaxial layers 342 and 344.

The second epitaxial layer 344 may fill the recessed region R' and extend above the substrate 301 from the first epitaxial layer 342. The height and shape of the second epitaxial layer 344 are not limited to those illustrated in FIG. 29.

The conductive layer 390 may be disposed on the second epitaxial layer 344 in the opening OP'. The conductive layer 390 may form a contact plug together with the epitaxial layer 340 in the semiconductor device 300. However, in example embodiments, the conductive layer 390 may be omitted and, in such a case, the contact plug may be formed of only the epitaxial layer 340.

Figure 30:
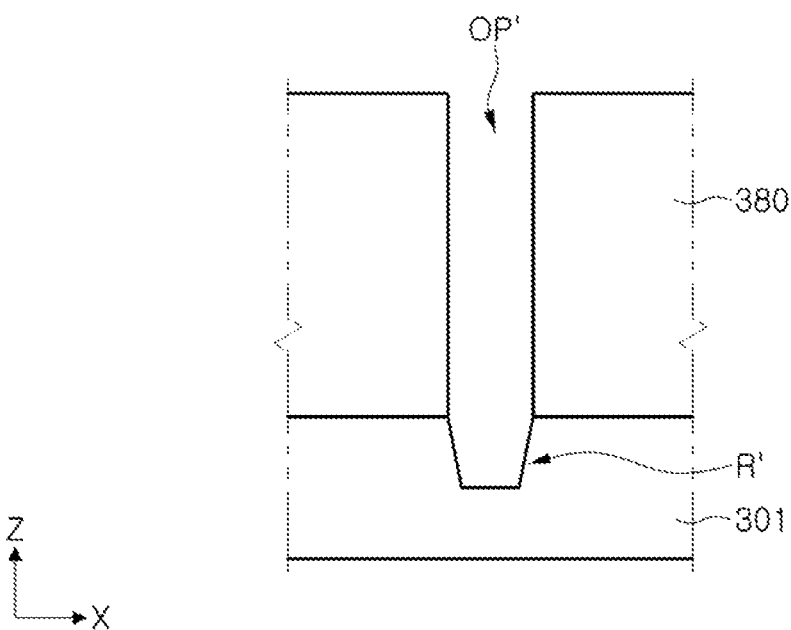
FIGS. 30 to 32 are views schematically illustrating main processes of a method of fabricating a semiconductor device according to example embodiments.
Figure 31:
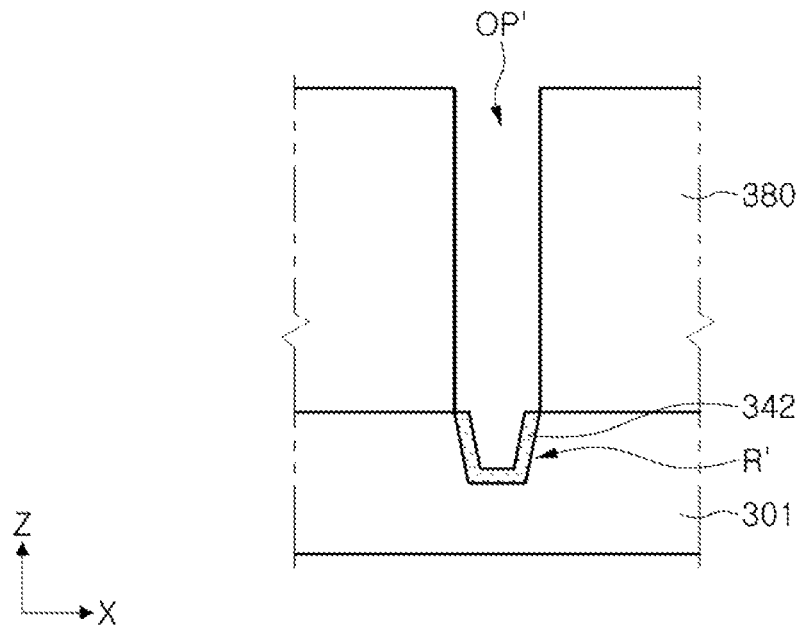
Figure 32:
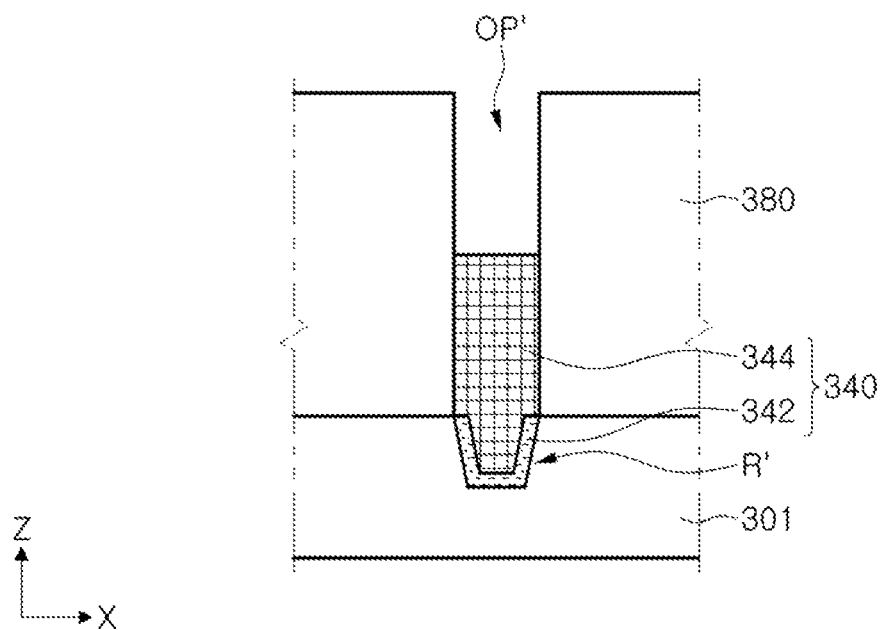

FIGS. 30 to 32 are views schematically illustrating main processes of a method of fabricating a semiconductor device according to example embodiments.

Referring to FIG. 30, an insulating layer 380 may be formed on the substrate 301, and an opening OP' passing through the insulating layer 380 may be formed.

The opening OP' may extend to the substrate 301 in a z-direction to form a recessed region R' in the substrate 301. When the opening OP' has a high aspect ratio, a sidewall of the opening OP' may not be perpendicular with respect to an upper surface of the substrate 301. For example, a width of opening OP' may decrease toward the upper surface of the substrate 301.

A depth of the recessed region R' may be determined depending on the width and the aspect ratio of the opening OP'.

Referring to FIG. 31, a first epitaxial layer 342 may be formed in the recessed region R' under the opening OP'. The first epitaxial layer 342 may be formed to be similar to the first epitaxial layers 142 described above with reference to FIG. 9.

The first epitaxial layer 342 may be formed by performing an SEG process using the substrate 301 exposed in the recessed region R' as a seed layer. The first epitaxial layer 342 may be grown to have a substantially uniform thickness on the recessed surface of the substrate 301. While forming the first epitaxial layer 342, impurities may be doped. The impurities may be the same conductivity type as or an opposite conductivity type to the impurities in the substrate 301.

The first epitaxial layer 342 may be formed at a relatively higher temperature and pressure than the second epitaxial layer 344 to be formed in the subsequent process. A source material, for example, dichlorosilane ($SiH_2Cl_2$) may be supplied at a relatively high flow rate. The first epitaxial layer 342 may be formed, for example, at a temperature in the range of about 800° C. to about 900° C. and a pressure in the range of about 10 Torr to 50 Torr. In particular, the first epitaxial layer 342 may be grown at a temperature within a mass transport limited regime, or a temperature relatively near those regimes.

In addition, the first epitaxial layer 342 may have a high atomic packing density, and thus may have a higher density than a second epitaxial layer 344 to be formed in the subsequent process.

Referring to FIG. 32, the second epitaxial layer 344 may be formed on the first epitaxial layer 342 in the opening OP'. The second epitaxial layer 344 may be formed to be similar to the second epitaxial layers 144 described above with reference to FIG. 10. The second epitaxial layer 344 may be formed by performing an SEG process using the first epitaxial layer 342 as a seed layer. The second epitaxial layer 344 may fill the recessed region R' and extend above the substrate 301. While forming the second epitaxial layer 344, impurities may be doped.

In example embodiments, the first epitaxial layers 342 and the second epitaxial layers 344 may be formed at different temperatures in the range of about 800° C. to about 900° C. In example embodiments, the first epitaxial layers 342 and the second epitaxial layers 344 may be formed at different pressures in the range of about 10 Torr to about 50 Torr. The second epitaxial layer 344 may be formed in-situ with the first epitaxial layer 342, and at a relatively lower temperature and lower pressure than the first epitaxial layer 342. In addition, a source material thereof may be supplied at a low flow rate. The second epitaxial layer 344 may be formed, for example, at a temperature and a pressure which are selected to be lower than those of the process of forming the first epitaxial layers 142 (e.g., in the range of about 800° C. to 900° C. and in the range of about 10 Torr to 50 Torr). In particular, the second epitaxial layer 344 may be grown at a temperature within a surface reaction limited regime, or a temperature relatively closer thereto than the temperature of growing the first epitaxial layer 342.

In such a manner, since the epitaxial layer 340 according to example embodiments is divided into two layers, that are, the first and second epitaxial layers 342 and 344, and then formed under different process conditions, defects generated in the interface with the substrate 301 may be reduced. Accordingly, when the epitaxial layer 340 is used as a contact plug, resistance or contact resistance thereof may be reduced, and failure generation due to the defects may be limited and/or prevented. In addition, when a plurality of epitaxial layers 340 are formed, thickness variation between the different epitaxial layers 340 may be reduced.

Next, referring to FIG. 29, a conductive layer 390 may be formed on the epitaxial layer 340. The conductive layer 390 may be connected to interconnection lines of the semiconductor device 300.

Figure 33:
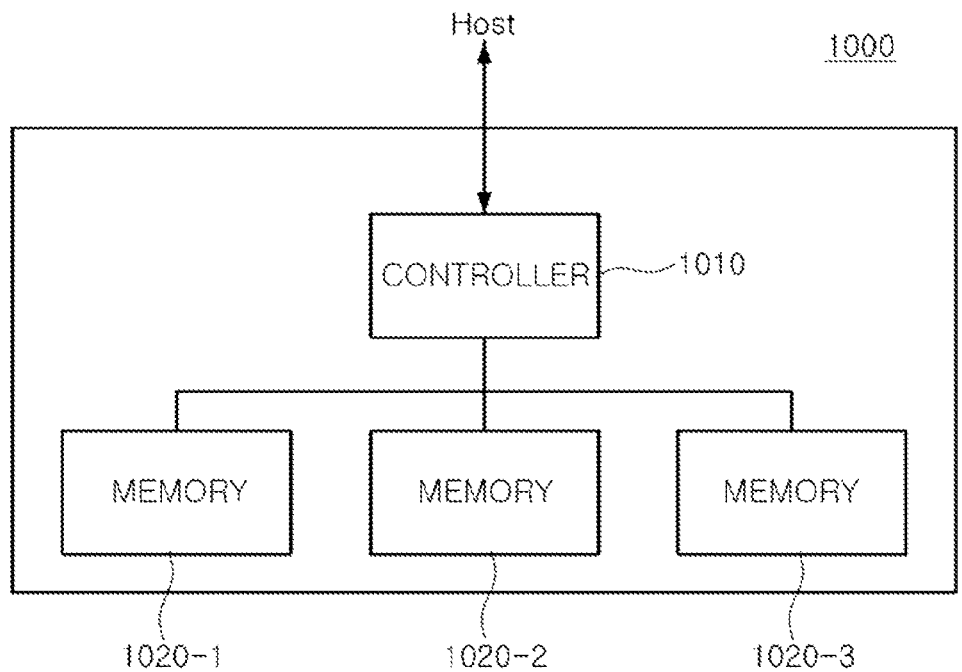
FIG. 33 is a block diagram illustrating a storage apparatus including a semiconductor device according to example embodiments.

FIG. 33 is a block diagram illustrating a storage apparatus including a semiconductor device according to example embodiments.

Referring to FIG. 33, a storage apparatus 1000 according to example embodiments may include a controller 1010 communicating with a host HOST, and memories 1020-1, 1020-2, and 1020-3 storing data. Each of the memories 1020-1, 1020-2, and 1020-3 may include a semiconductor device according to example embodiments, described above with reference to FIGS. 1 to 6C, 18 to 19C, and 28 to 32.

The host HOST communicating with the controller 1010 may be a variety of electronic apparatuses in which the storage apparatus 1000 is installed, for example, a smartphone, a digital camera, a desktop PC, a laptop computer, or a media player. The controller 1010 may receive a request for data read or write from the host HOST to generate a command CMD for storing data in the memories 1020-1, 1020-2, and 1020-3 or withdrawing data from the memories 1020-1, 1020-2, and 1020-3.

As illustrated in FIG. 33, one or more memories 1020-1, 1020-2, and 1020-3 may be connected to the controller 1010 in parallel in the storage apparatus 1000. By connecting the plurality of memories 1020-1, 1020-2, and 1020-3 to the controller 1010 in parallel, a storage apparatus 1000 having a large capacity, such as a solid state drive (SSD).

Figure 34:
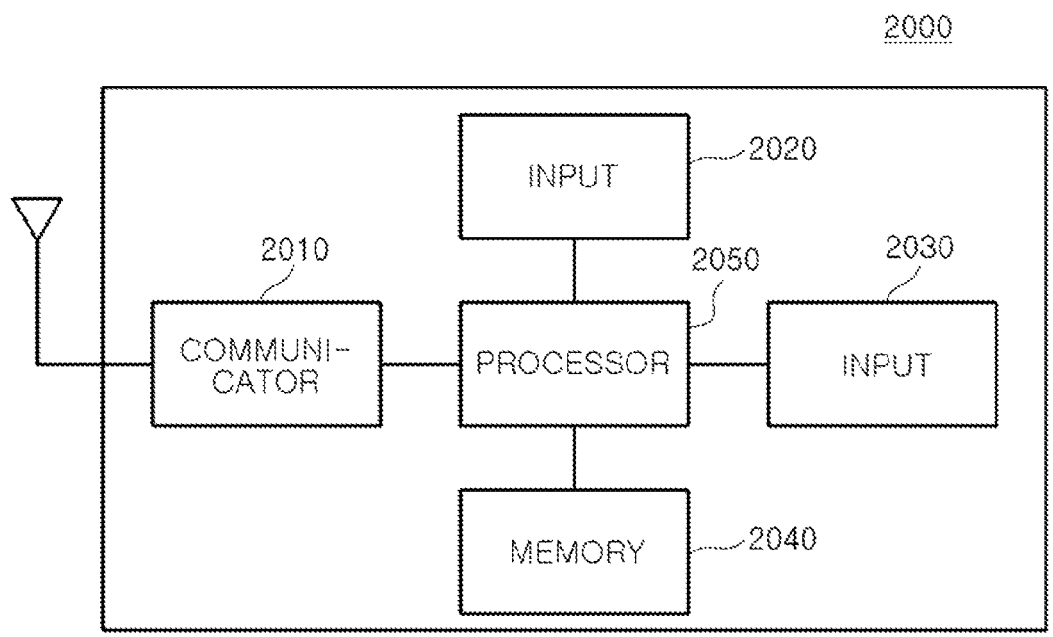
FIG. 34 is a block diagram illustrating an electronic apparatus including a semiconductor device according to example embodiments.

FIG. 34 is a block diagram illustrating an electronic apparatus including a semiconductor device according to example embodiments.

Referring to FIG. 34, an electronic apparatus 2000 according to example embodiments may include a communicator 2010, an input 2020, an output 2030, a memory 2040, and a processor 2050.

The communicator 2010 may include a wired/wireless communications module, such as a wireless internet module, a short-range communications module, a GPS module, or a mobile communications module. The wired/wireless communications module included in the communicator 2010 may be connected to an external communications network by a variety of communications standards to transmit and receive data.

The input 2020 is a module supplied for a user to control an operation of the electronic apparatus 2000, and includes a mechanical switch, a touch screen, a voice recognition module, or the like. In addition, the input 2020 may include a track ball, a laser pointer mouse, or a touch interaction, and further include a variety of sensor modules in which a user can input data.

The output 2030 may output information processed by the electronic apparatus 2000 in an audio or video form. The memory 2040 may store a program for processing or controlling of the processor 2050, or data. The memory 2040 may include one or more semiconductor devices according example embodiments, described above with reference to FIGS. 1 to 6C, 18 to 19C, and 28 to 32. The processor 2050 may store or withdraw data by transmitting a command to memory 2040 according to a required operation.

The memory 2040 may be embedded in the electronic apparatus 2000 or communicate with the processor 2050 through a separate interface. When the memory 2040 communicates with the processor 2050 through the separate interface, the processor 2050 may store data in or withdraw data from the memory 2040 by a variety of interface standards, such as SD, SDHC, SDXC, MICRO SD, or USB.

The processor 2050 may control operations of each unit included in the electronic apparatus 2000. The processor 2050 may perform controlling or processing operations related to voice calls, video calls, or data communication, or controlling or processing operations for multimedia playback and management. In addition, the processor 2050 may process an input transmitted through the input 2020 from a user, and output a result thereof through the output 2030. Further, the processor 2050 may store data required to control operations of the electronic apparatus 2000 in the memory 2040, or withdraw the data from the memory 2040.

As set forth above, according to example embodiments, since a first epitaxial layer is formed at high temperature and high pressure, and then a second epitaxial layer is formed using the first epitaxial layer as a seed layer, a semiconductor device having improved reliability, a method of fabricating the semiconductor device, and a method of forming an epitaxial layer having improved quality may be provided.

While some example embodiments have been particularly shown and described, it will be understood by one of ordinary skill in the art that variations in form and detail may be made therein without departing from the spirit and scope of the claims.

What is claimed is:

1. A method of fabricating a semiconductor device, comprising:
   alternately stacking interlayer insulating layers and sacrificial layers on a substrate;
   forming recessed regions in the substrate, the forming recessed regions including forming openings passing through the interlayer insulating layers and the sacrificial layers;
   forming first epitaxial layers on recessed surfaces of the recessed regions;
   forming second epitaxial layers using the first epitaxial layers as seed layers, the second epitaxial layers filling the recessed regions and extending above the substrate; and
   forming channel layers in the openings on the second epitaxial layers.

2. The method of claim 1, wherein the first epitaxial layers are formed at a higher temperature and a higher pressure than the second epitaxial layers.

3. The method of claim 1, wherein the first epitaxial layers are formed at a higher growth rate than the second epitaxial layers.

4. The method of claim 3, wherein the first epitaxial layers are formed to have a higher density than the second epitaxial layers.

5. The method of claim 1, wherein the first epitaxial layers and the second epitaxial layers are formed at different temperatures in the range of about 800° C. to about 900° C.

6. The method of claim 1, wherein the first epitaxial layers have a substantially uniform thickness and do not extend above the substrate.

7. The method of claim 1, wherein a thickness of the first epitaxial layers is in the range of about 2% to about 9% of a thickness of the second epitaxial layers.

8. The method of claim 7, wherein the thickness of the first epitaxial layers is in the range of about 3 nm to about 10 nm.

9. The method of claim 1, further comprising:
   cleaning the substrate before forming the first epitaxial layers, wherein
   the cleaning the substrate includes using at least one of a germanium-containing material and a chlorine-containing material, and
   wherein the cleaning the substrate, the forming the first epitaxial layers, and the forming the second epitaxial layers are performed in-situ.

10. The method of claim 1, further comprising:
    forming gate dielectric layers on the second epitaxial layers along sidewalls of the openings before forming the channel layers, wherein the gate dielectric layers include blocking layers, charge storage layers, and tunneling layers;

forming lateral openings by removing the sacrificial layers;
oxidizing portions of the blocking layers and the second epitaxial layers exposed by the lateral openings; and
forming gate electrodes by filling the lateral openings with a conductive material.

11. The method of claim 10, wherein the oxidizing portions of the blocking layers and the second epitaxial layers include oxidizing the portions of the second epitaxial layers to form insulating layers between the second epitaxial layers and the gate electrodes.

12. The method of claim 1, further comprising forming pads in the openings,
wherein the pads are contact with upper portions of the channel layers.

13. The method of claim 12, further comprising:
forming an additional opening passing through the interlayer insulating layers and the sacrificial layers to expose the sacrificial layers;
removing the exposed sacrificial layers to form lateral opening;
forming gates in the lateral opening;
forming common source line in the additional opening; and
forming bit lines on the pads.

14. A method of fabricating a semiconductor device, comprising:
alternately stacking interlayer insulating layers and intermediate layers on a substrate;
forming recessed regions in the substrate, the forming recessed regions including forming openings passing through the interlayer insulating layers and the intermediate layers;
forming first epitaxial layers on recessed surfaces of the recessed regions;
forming second epitaxial layers in the recessed regions using the first epitaxial layers as seed layers, the second epitaxial layers having a lower density than the first epitaxial layers; and
forming channel layers in the openings on the second epitaxial layers.

15. The method of claim 14, wherein
the alternately stacking interlayer insulating layers and intermediate layers includes using conductive layers as the intermediate layers to form the interlayer insulating layers and the conductive layers alternately stacked on the substrate; and
the forming recessed regions includes forming openings passing through the interlayer insulating layers and the conductive layers.

16. The method of claim 15, wherein the first epitaxial layers are formed at a higher temperature and a higher pressure than the second epitaxial layers.

17. The method of claim 15, further comprising:
forming insulating layers alongside surfaces of the openings on the first epitaxial layers before forming the second epitaxial layers.

18. The method of claim 14, further comprising:
forming gate dielectric layers in the openings on top of the second epitaxial layers before forming the channel layers; and
forming bit lines on top of the channel layers, wherein the gate dielectric layers are between the channel layers and the interlayer insulating layers.

19. The method of claim 18, further comprising:
forming lateral openings by removing the intermediate layers; and
forming gate electrodes by filling the lateral openings with a conductive material.

20. The method of claim 14, wherein the first epitaxial layers are formed using a first selective epitaxial growth (SEG) process operating within a mass transport limited regime, and
the second epitaxial layers are formed using a second SEG process operating in a surface reaction limited regime.

* * * * *